US010514476B2

(12) United States Patent
Hahn

(10) Patent No.: US 10,514,476 B2
(45) Date of Patent: Dec. 24, 2019

(54) ADJUSTABLE SENSITIVITY MAGNET SENSOR

(71) Applicant: Christopher James Hahn, Longmont, CO (US)

(72) Inventor: Christopher James Hahn, Longmont, CO (US)

( * ) Notice: Subject to any disclaimer, the term of this patent is extended or adjusted under 35 U.S.C. 154(b) by 0 days.

(21) Appl. No.: 16/261,740

(22) Filed: Jan. 30, 2019

(65) Prior Publication Data

US 2019/0154864 A1    May 23, 2019

Related U.S. Application Data

(60) Provisional application No. 62/721,502, filed on Aug. 22, 2018.

(51) Int. Cl.
| | | |
|---|---|---|
| *G01V 3/08* | (2006.01) | |
| *G01R 33/00* | (2006.01) | |
| *G01R 33/07* | (2006.01) | |

(52) U.S. Cl.
CPC .......... *G01V 3/081* (2013.01); *G01R 33/0011* (2013.01); *G01R 33/07* (2013.01)

(58) Field of Classification Search
CPC ........ G01D 5/142; G01D 5/145; G01D 5/147; G01R 33/0011; G01R 33/06; G01R 33/07; G01R 33/072; G01R 33/0017; G01R 33/0041; G01V 3/081
See application file for complete search history.

(56) References Cited

U.S. PATENT DOCUMENTS

| | | | |
|---|---|---|---|
| 4,293,814 A | 10/1981 | Boyer | |
| 4,717,864 A | 1/1988 | Fultz | |
| 5,285,154 A | 2/1994 | Burreson | |
| 5,705,924 A | 1/1998 | Jeffers | |
| 5,986,450 A | 11/1999 | Haigh et al. | |
| 6,002,350 A | 12/1999 | Checa et al. | |
| 6,522,131 B1 * | 2/2003 | Hiligsmann | G01D 3/02 |
| | | | 324/174 |
| 6,829,952 B2 | 12/2004 | Stanley et al. | |
| 6,843,143 B2 | 1/2005 | Steele et al. | |
| 7,082,823 B1 | 8/2006 | Shipman et al. | |
| 7,301,334 B2 | 11/2007 | Shen et al. | |

(Continued)

*Primary Examiner* — Huy Q Phan
*Assistant Examiner* — Dustin R Dickinson
(74) *Attorney, Agent, or Firm* — Thomas J. Lavan

(57) ABSTRACT

A device is provided. The device includes one or more of a radially-wound coil, a hall-effect sensor, a power source, and a control circuit. The radially-wound coil is configured to produce a first magnetic field in response to a DC current applied to the coil. The hall-effect sensor includes a sensor output that indicates proximity of a magnet to the hall-effect sensor. The magnet produces a second magnetic field and the sensor output indicates proximity in response to a sum of a strength of the first magnetic field and a strength of the second magnetic field at the hall-effect sensor exceeds a trip level. The radially-wound coil is in fixed proximity to the hall-effect sensor. The power source is coupled to the hall-effect sensor and is configured to provide power that alternates between on and off voltages to the hall-effect sensor. The control circuit is configured to receive the sensor output and in response provide the DC current to the radially-wound coil in order to control a polarity of the first magnetic field to detect the magnet.

14 Claims, 16 Drawing Sheets

(56) References Cited

U.S. PATENT DOCUMENTS

| | | |
|---|---|---|
| 7,602,271 B2 | 10/2009 | York et al. |
| 7,764,154 B2 | 7/2010 | York et al. |
| 7,777,482 B2 | 8/2010 | Munz et al. |
| 7,876,186 B2 | 1/2011 | York et al. |
| 8,120,351 B2 | 2/2012 | Rettig et al. |
| 8,801,361 B2 | 8/2014 | Hawkins |
| 9,933,323 B2 | 4/2018 | Schweizer et al. |
| 10,012,518 B2 | 7/2018 | David et al. |
| 2004/0122334 A1 | 6/2004 | Yamashiro |
| 2005/0127901 A1* | 6/2005 | Johnson ................. G01D 5/147 324/207.2 |
| 2012/0249124 A1* | 10/2012 | Ionescu ................ G01R 33/072 324/207.2 |
| 2014/0145714 A1* | 5/2014 | Okatake ................. G01R 33/07 324/225 |
| 2014/0266159 A1 | 9/2014 | Heremans et al. |
| 2015/0022193 A1* | 1/2015 | Burdette ................ G01N 27/72 324/239 |
| 2017/0284829 A1 | 10/2017 | Cai |
| 2018/0031628 A1 | 2/2018 | Ahrens et al. |
| 2018/0364066 A1* | 12/2018 | Satz .......................... G01D 5/12 |
| 2019/0094313 A1* | 3/2019 | Bolsinger ............ G01R 33/072 |

\* cited by examiner (1) Field Polarity Sympathetically Aligned; Magnet Not Detected (2) Field Polarity Sympathetically Aligned; Magnet Detected (1) 716 Trip Level Not Exceeded – Static Sensor Output (2) 716 Trip Level Exceeded – Active Sensor Output (1) Field Polarity Non-Sympathetically Aligned; Magnet Not Detected (2) Field Polarity Non-Sympathetically Aligned; Magnet Not Detected (1) 716 Trip Level Not Exceeded – Static Sensor Output (2) 716 Trip Level Not Exceeded – Static Sensor Output (1) Field Polarity Partially Sympathetically Aligned; Magnet Not Detected (2) Field Polarity Partially Sympathetically Aligned; Magnet Not Detected (1) 716 Trip Level Not Exceeded – Static Sensor Output (2) 716 Trip Level Not Exceeded – Static Sensor Output (1) Field Polarity Partially Sympathetically Aligned; Magnet Not Detected (2) Field Polarity Partially Sympathetically Aligned; Magnet Detected (1) 716 Trip Level Not Exceeded – Static Sensor Output (2) 716 Trip Level Exceeded – Active Sensor Output

ADJUSTABLE SENSITIVITY MAGNET SENSOR

CROSS REFERENCE TO RELATED APPLICATION(S)

This application claims priority to earlier filed provisional application No. 62/721,502 filed Aug. 22, 2018 and entitled "ADJUSTABLE SENSITIVITY MAGNET SENSOR", the entire contents of which are hereby incorporated by reference.

FIELD

The present application is directed to devices and method for sensing magnets. In particular, the present application is directed to methods and apparatuses for an adjustable sensitivity magnet sensor.

BACKGROUND

Conventional position & proximity sensing technologies require benign environments—and/or transmitter/receiver pairs (photo sensors, for example). Such techniques may be constrained to pass the object between two parallel elements, such as, a receiver/transmitter pair. Several types of sensors have traditionally been used for various forms of object detection, including optical sensors, color sensors, touch sensors, ultrasonic sensors, infrared sensors, and Sonar and laser sensors.

Light sensors may be included in the proximity sensor category, and are simple sensors that change the voltage of photoresistors or photovoltaic cells in accordance with the amount of light detected. Light sensors may be, for example, used in very popular applications for autonomous robots that track a marked path.

With color sensors, different colors are reflected with different intensity, for example, an orange color reflects red light in an amount greater than a green color. Color sensors are in the same general category as light sensors, but with a few extra features that can be useful for applications where it is necessary to detect the presence of an object with a certain color or to detect the types of objects on surfaces.

Touch sensors may be included in the proximity sensors category and are designed to sense objects at a small distance with or without direct contact. These sensors are designed to detect changes in capacitance between the onboard electrodes and an object.

Ultrasonic sensors are designed to generate high frequency sound waves and receive an echo reflected by an object. These sensors are used in a wide range of applications and are very useful when it is not important to detect colors, surface textures, or transparency. Ultrasonic sensors may have the following advantages: the output value is linear with the distance between the sensor and the target, the sensor response is not dependent on the colors, transparency of objects, optical reflection properties, or by the surface texture of the object, they are designed for contact-free detection, sensors with digital (ON/OFF) outputs have excellent repeat sensing accuracy, they provide accurate detection of even small objects, and they may work in critical conditions such as dirt and dust. However, ultrasonic sensors may have the following disadvantages: they must view a high density surface for good results (e.g., a soft surface such as foam and cloth has low density and may absorb sound waves emitted by the sensor, they could experience false detection if some loud noises are received, they have a response time slightly less than other types of sensors, they have a minimum sensing distance, and some changes in the environment may affect the response of the sensor (temperature, humidity, pressure, etc.).

Infrared sensors measure infrared (IR) light that is transmitted in the environment to find objects by an IR light-emitting diode (LED). This type of sensor is very popular in navigation for object avoidance, distance measurements, or line following applications. IR sensors are very sensitive to IR lights and sunlight, which makes them useful for applications requiring great precision in spaces with low light. IR sensors may have the following advantages: they may detect infrared light over large areas, they may operate in real-time, they use non-visible light for detection, and they are inexpensive. Disadvantages of IR sensors is they are inherently very sensitive to IR lights and sunlight while be weak in sensing objects of darker colors such as black.

Sonar sensors maybe used primarily in navigation for object detection, even for small objects. These sensors have high performance on the ground and in water. Laser sensors may be very useful for tracking and detection targets located at a long distances. The distance between sensor and target is measured by calculating the speed of light and the time to receive a return. Laser sensors are very precise in measurement.

SUMMARY

The present application is directed to solving disadvantages of the prior art. In accordance with embodiments of the present application, a device is provided. The device includes a radially-wound coil, a hall-effect sensor, a power source, and a control circuit. The radially-wound coil is configured to produce a first magnetic field in response to a DC current applied to the coil. The hall-effect sensor includes a sensor output that indicates proximity of a magnet to the hall-effect sensor. The magnet produces a second magnetic field and the sensor output indicates proximity in response to a sum of a strength of the first magnetic field and a strength of the second magnetic field at the hall-effect sensor exceeds a trip level. The radially-wound coil is in fixed proximity to the hall-effect sensor. The power source is coupled to the hall-effect sensor and is configured to provide power that alternates between on and off voltages. The control circuit is configured to receive the sensor output and in response provide the DC current to the radially-wound coil in order to control a polarity of the first magnetic field to detect the magnet.

In accordance with another embodiment of the present application, a system is provided. The system includes one or more of a sense circuit, a magnet, and a control circuit. The sense circuit includes a radially-wound coil configured to produce a first magnetic field that corresponds to a DC current applied to the coil and a hall-effect sensor. The hall-effect sensor includes a sensor output provided in response to a trip level. The radially-wound coil is in fixed proximity to the hall-effect sensor. The magnet provides a second magnetic field and is configured to move in one or more directions with respect to the hall-effect sensor. The control circuit is coupled to the sense circuit and is configured to induce the DC current to the radially-wound coil. The sensor output indicates proximity of the magnet to the hall-effect sensor in response to a combination of a strength of the first magnetic field and a strength of the second magnetic field at the hall-effect sensor exceeds the trip level.

In accordance with yet another embodiment of the present application, a method is provided. The method includes one or more of inducing a first magnetic field in a radially-wound coil by a DC current, moving a magnet producing a second magnetic field within a detection range of the hall-effect sensor, indicating detection of the magnet, by a sensor output of the hall-effect sensor, in response to a sum of a strength of the first magnetic field and a strength of the second magnetic field exceeds a trip level of the hall-effect sensor, providing the DC current in response to detecting the magnet by maintaining the DC current at a same level the DC current was at when the magnet was detected, while the magnet is detected, and resuming the DC current at the bias level in response to the hall-effect sensor no longer detects the magnet. The DC current provides the bias level of the hall-effect sensor in fixed proximity to the radially-wound coil, where the trip level is higher than the bias level.

DETAILED DESCRIPTION

Magnetic object sensing presents several notable advantages over various alternatives. For example, an integrated transmitter/receiver pair at a common location may be used to detect a magnet without requiring the magnet to pass between the receiver and transmitter to be detected. In another example, a magnet or a magnet attached to an object may be detected in spite of intervening non-magnetic materials. Non-magnetic materials include clothing, wood, paper, plastics, glass, ceramics, and non-magnetized metals.

Existing magnetic sensors typically sense magnets over a range of a few (or perhaps tens of) milliTeslas. This means that a strong (larger/heavier) magnet may be required to trigger the sensor—and/or from a close distance. From this observation, the need to be able to tune the sensitivity of the magnetic-sensor is identified. The present application describes an apparatus that can sense small permanent magnets producing field strengths ranging from tens of milliTeslas to a few tens of microTeslas (i.e., fields on the order of field strength of the earth's magnetic field).

For most embodiments, the sensed element may be very lightweight compared to the weight of an object incorporating the sensed element. Sensing in most cases should further be non-contact sensing. However, conventional magnet sensing methods only operate over very small distances (typically less than one inch for either position or proximity), while reluctance approaches required a "flying magnet", traveling at high speed. (e.g., a magnet embedded in a tooth on a geared flywheel passing nearby to a hall-effect sensor). The present application meets these stated needs—permitting close tolerance positional sensing (down to zero-speed, or not moving)—over a range exceeding two feet. Additionally, moving objects at high relative velocities, non-linear movement paths, and acceleration/deceleration may be tracked.

Figure 1:
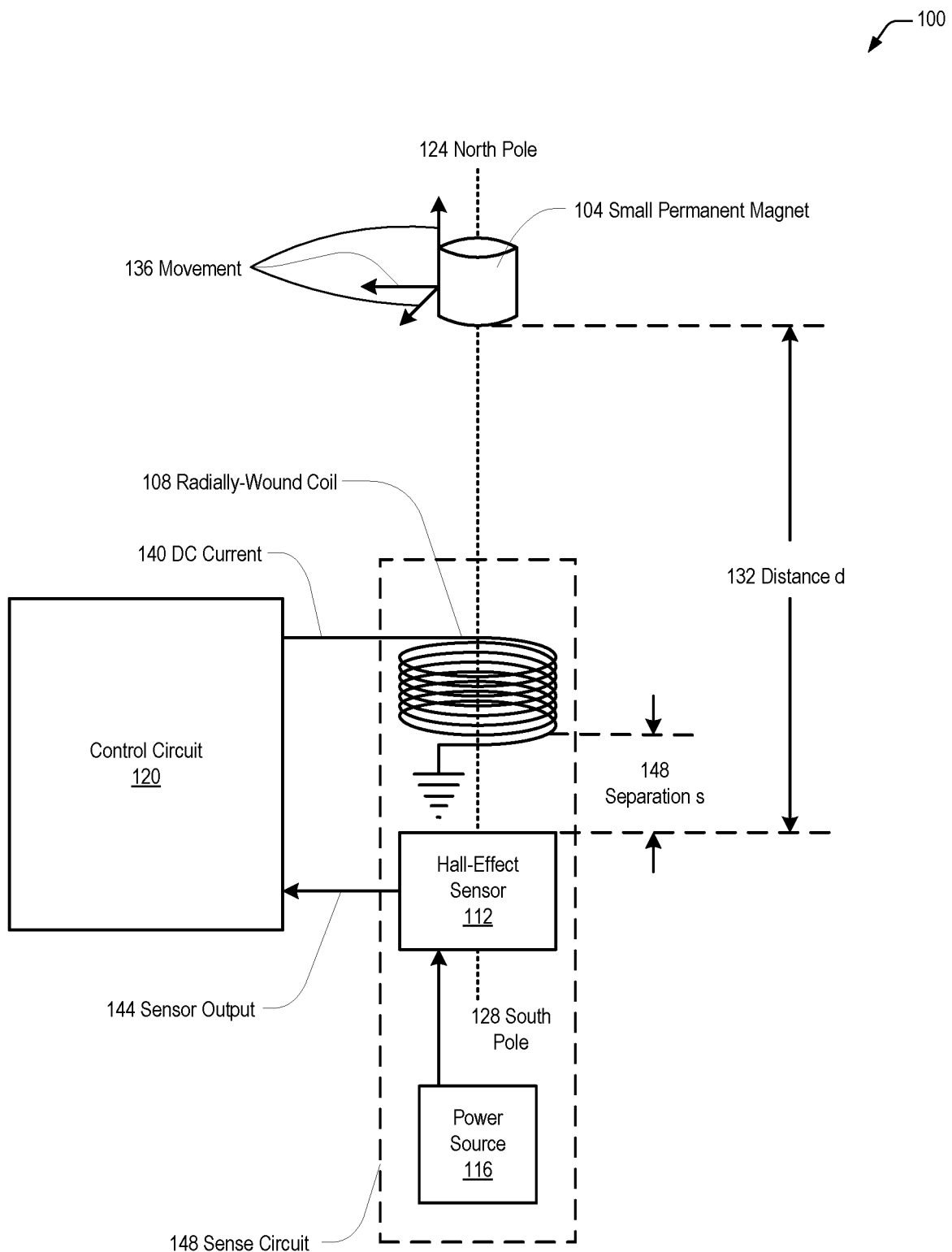
FIG. 1 is a diagram illustrating an adjustable sensitivity magnet sensor in accordance with embodiments of the present application.

Referring now to FIG. 1, a diagram illustrating an adjustable sensitivity magnet sensor 100 in accordance with embodiments of the present application is shown. The adjustable-sensitivity magnet sensor 100 includes a hall-effect sensor 112 powered by a power source 116. A hall-effect sensor 112 is a transducer that varies its output voltage in response to a magnetic field. Hall-effect sensors 112 are used for proximity switching, positioning, speed detection, and current sensing applications. In a hall-effect sensor 112, a thin strip of metal has a current applied along it. In the presence of a magnetic field, the electrons in the metal strip are deflected toward one edge, producing a voltage gradient across the short side of the strip (perpendicular to the feed current). Hall-effect sensors 112 have an advantage over inductive sensors in that, while inductive sensors respond to a changing magnetic field which induces current in a coil of wire and produces voltage at its output, hall-effect sensors 112 can detect static (non-changing) magnetic fields. In its simplest form, the sensor operates as an analog transducer, directly returning a voltage. Hall-effect sensors 112 have a specified trip point or trip level, which is a level of detected magnetic flux at which a sensor output 144 of the hall-effect sensor 112 indicates detection of a magnet or small permanent magnet 104. While a hall-effect sensor 112 by itself can detect magnets 104 having strong magnetic fields or in very close proximity, they are sometimes not as effective in detecting smaller magnets 104 having weaker magnetic fields or magnets 104 located at greater distances d 132 from the hall-effect sensor 112.

In order to increase the detection sensitivity of the hall-effect sensor 112, the hall-effect sensor 112 and power source 116 is combined with a radially-wound coil 108 to form a sense circuit 148. The radially-wound coil 108 produces a magnetic field of its own (first magnetic field) in response to a DC current 140 applied to the coil 108. The strength of the first magnetic field is determined by the DC current 140. The purpose of the radially-wound coil 108 is to bias the hall-effect sensor 112, through the first magnetic field, to a bias level slightly lower than the trip level of the hall-effect sensor 112. The concept is that a magnet 104 producing a second magnetic field will combine with the first magnetic field in such a way that the combination (sum) of the first magnetic field and the second magnetic field exceeds the trip level of the hall-effect sensor 112. Put another way, the strength of the second magnetic field (due to the magnet 104) trips the hall-effect sensor 112 and sensor output 144 if the strength of the second magnetic field is greater than the difference between the bias level and the trip level.

The magnet 104 may be static or moving 136 in one or more directions, with constant or varying velocity, and with constant or varying acceleration. The directions may include any combination of horizontal, vertical, elliptical, curved, or random movement. The movement may start or stop any number of times. The magnet 104 produces a second magnetic field having a north pole 124 and south pole 128, however, the second magnetic field may have any spatial or positional relationship with respect to the first magnetic field. Magnetic sensing by the sense circuit 148 is optimized when the north-south polarity of the first magnetic field directly coincides with second magnetic field. Thus, a sensing distance d 132 is maximized when the polarities coincide. Details of the effect of polarity on magnet sensing are described in more detail in FIGS. 7A-7D.

In order for the sense circuit 148 to perform efficiently and optimally, especially with weak and/or distant magnets 104, the spatial relationship between the hall-effect sensor 112 and the radially-wound coil 108 is important. It should be understood that at all times, the separation distance s between the hall-effect sensor 112 and the radially-wound coil 108 is fixed, the polarities of both are always completely aligned, and the orientations of both to each other does not change. Thus, there is always a fixed spatial relationship between the hall-effect sensor 112 and the radially-wound coil 108.

First, the hall-effect sensor 112 and the radially-wound coil 108 are constrained to be separated by no more than a separation distance s 148. Although there is no minimum practical separation distance s 148 (ideally, the hall-effect sensor 112 and the radially-wound coil 108 are in direct contact, or touching), increasing the separation distance s 148 means that a higher level of DC current 140 will be required in order to bias the hall-effect sensor 112 to the desired bias level. In some embodiments, the hall-effect sensor 112 and the radially-wound coil 108 are separated by no more than 1 centimeter.

Second, magnetic pole positioning (polarity) of the hall-effect sensor 112 and the radially-wound coil 108 are always aligned and coincident. Therefore, the north pole 124 orientation of both should always coincide, and therefore the south pole 128 orientation of both (since directly opposite to the north pole 124 orientation) should also always coincide.

Third, the radially-wound coil 108 should be centered with respect to the hall-effect sensor 112. By centering the radially-wound coil 108 with the hall-effect sensor 112, the sense circuit 148 is horizontally symmetric and able to sense magnets 104 with equal sensitivity in all directions.

Fourth, the hall-effect sensor 112 and the radially-wound coil 108 are coaxial with each other such that the first magnetic field and sensor 112 point of maximum sensitivity are coincidental.

Figure 2:
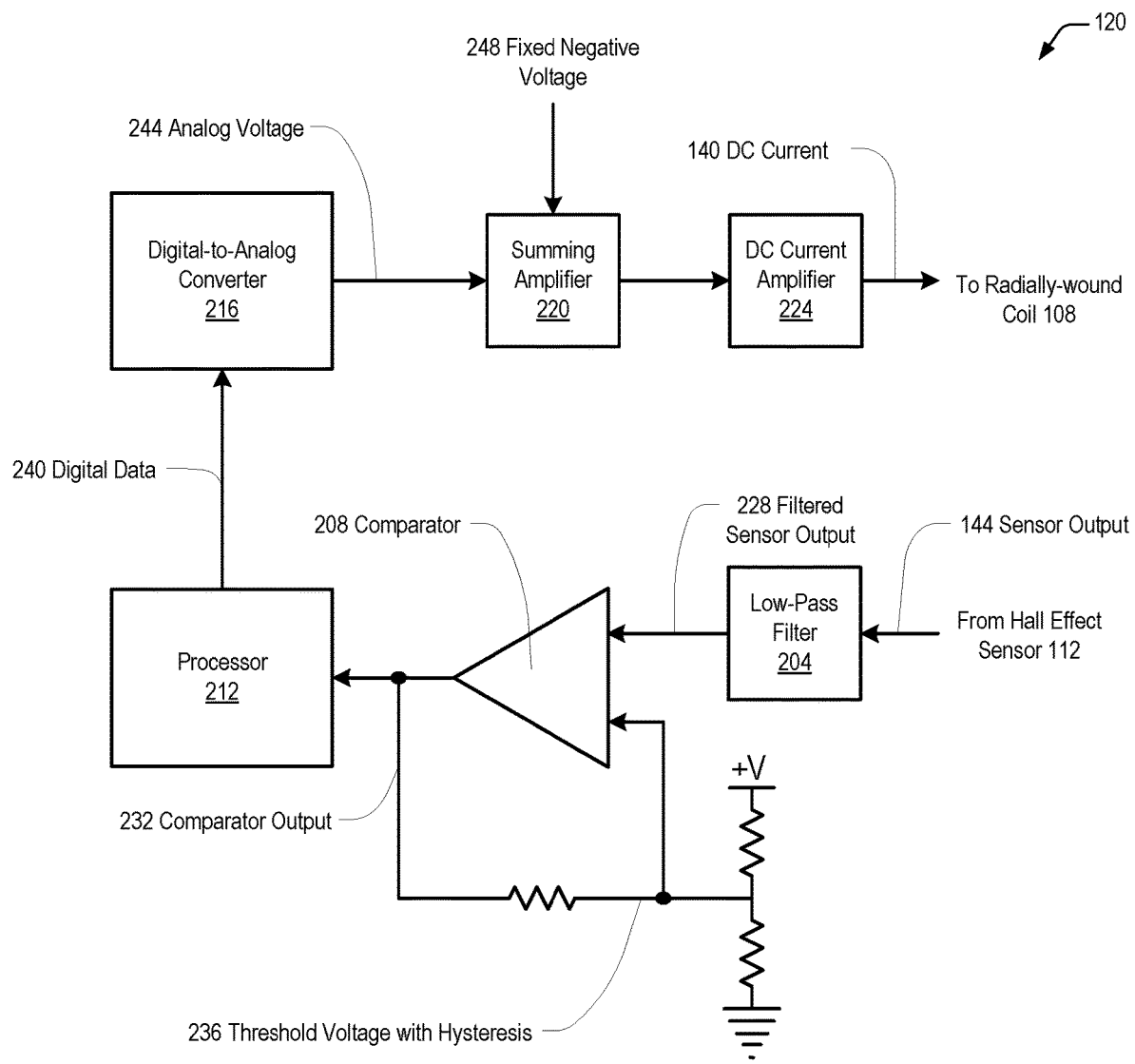
FIG. 2 is a block diagram illustrating a control circuit in accordance with embodiments of the present application.

The adjustable sensitivity magnet sensor 100 also includes a control circuit 120, which is described in more detail with respect to FIG. 2. The control circuit 120 receives the sensor output 144 from the hall-effect sensor 112, and provides the DC current 140 to the radially-wound coil 108.

An advantage of the present application is it is able to sense magnets accurately from only a single direction. This allows the construction of the apparatus to be simplified. Additionally, sensing apparatuses that sense from opposite sides are inherently restricted by the spacing between sensing elements and require a magnet or object to pass between the sensing elements, to some degree.

Referring now to FIG. 2, a diagram illustrating a control circuit 120 in accordance with embodiments of the present application is shown. The control circuit 120 receives a sensor output 144 from the hall-effect sensor 112, and provides a DC current 140 to the radially-wound coil 108.

The sensor output 144 is a generally "noisy" signal that indicated the hall-effect sensor 112 is currently detecting a magnet 104. It is advantageous to clean up the signal in order that it may be accurately interpreted. In one embodiment, a low-pass filter 204 provides a filtered sensor output 228 to a comparator 208, which provides a clean comparator output 232 to be used by a processor 212. The comparator 208 compares the filtered sensor output 228 to a threshold voltage with hysteresis 236—which is a fed back form of the comparator output 232. The threshold voltage with hysteresis 236 utilizes voltage divider and feedback resistors to condition the comparator output 232 to levels optimized for the comparator 208. No specific values are shown since that is implementation-dependent and depends on the comparator 208 device used, characteristics of the filtered sensor output 228, and signaling requirements for the processor 212. Although the embodiment illustrated uses hardware low-pass filter 204 and comparator 208 components, it should be understand that many other forms of signal conditioning may be equivalently used without deviating from the scope of the present application—including digital signal processing and software-based signal conditioning by the processor 212 or another device.

The processor 212 represents a central processing unit (CPU) and associated memory resources to interpret the comparator output 232, and in some embodiments provide control data 240 for the DC current 140 that directly corresponds to the comparator output 232.

The processor 212 executes an operating system and one or more software applications, which are generally stored in the memory resources. The processor 212 may include any type of processor known in the art, including embedded CPUs, RISC CPUs, Intel or Apple-compatible CPUs, and may include any combination of hardware and software. Processor 212 may include several devices including field-programmable gate arrays (FPGAs), memory controllers, North Bridge devices, and/or South Bridge devices. Although in most embodiments, processor 212 fetches application program instructions and metadata from the memory resources, it should be understood that processor 212 and applications may be configured in any allowable hardware/software configuration, including pure hardware configurations implemented in ASIC or FPGA forms.

The memory resources may include one or both of volatile and nonvolatile memory types. In some embodiments, the memory resources include firmware which includes program instructions that processor 212 fetches and executes, including program instructions for the processes disclosed herein. Examples of non-volatile memory may include, but are not limited to, flash memory, SD, Erasable Programmable Read Only Memory (EPROM), Electrically Erasable Programmable Read Only Memory (EEPROM), hard disks, and Non-Volatile Read-Only Memory (NOVRAM). Volatile memory stores various data structures and user data. Examples of volatile memory may include, but are not limited to, Static Random Access Memory (SRAM), Dual Data Rate Random Access Memory (DDR RAM), Dual Data Rate 2 Random Access Memory (DDR2 RAM), Dual Data Rate 3 Random Access Memory (DDR3 RAM), Zero Capacitor Random Access Memory (Z-RAM), Twin-Transistor Random Access Memory (TTRAM), Asynchronous Random Access Memory (A-RAM), ETA Random Access Memory (ETA RAM), and other forms of temporary memory. The memory resources may store any combination of metadata and one or more applications. Metadata may include various data structures in support of the operating system and software applications.

The processor 212 provides digital data 240 to a digital-to-analog converter (DAC) 216, which converts the digital data 240 into an analog voltage 244. A summing amplifier 220 receives the analog voltage 244 and adds to it a fixed negative voltage 248 (which reflects the bias level for the hall-effect sensor 112). The summing amplifier output drives a DC current amplifier 224, which provides the DC current 140 to the radially-wound coil 108. Like the filtering circuits 204, 208, it should be understood there are many different and equivalent circuits for converting the digital data 240 from the processor 212 into the DC current 140 to the radially-wound coil 108. Use of such equivalent circuits may be used in lieu of the circuits shown without deviating from the scope of the present application.

Figure 3:
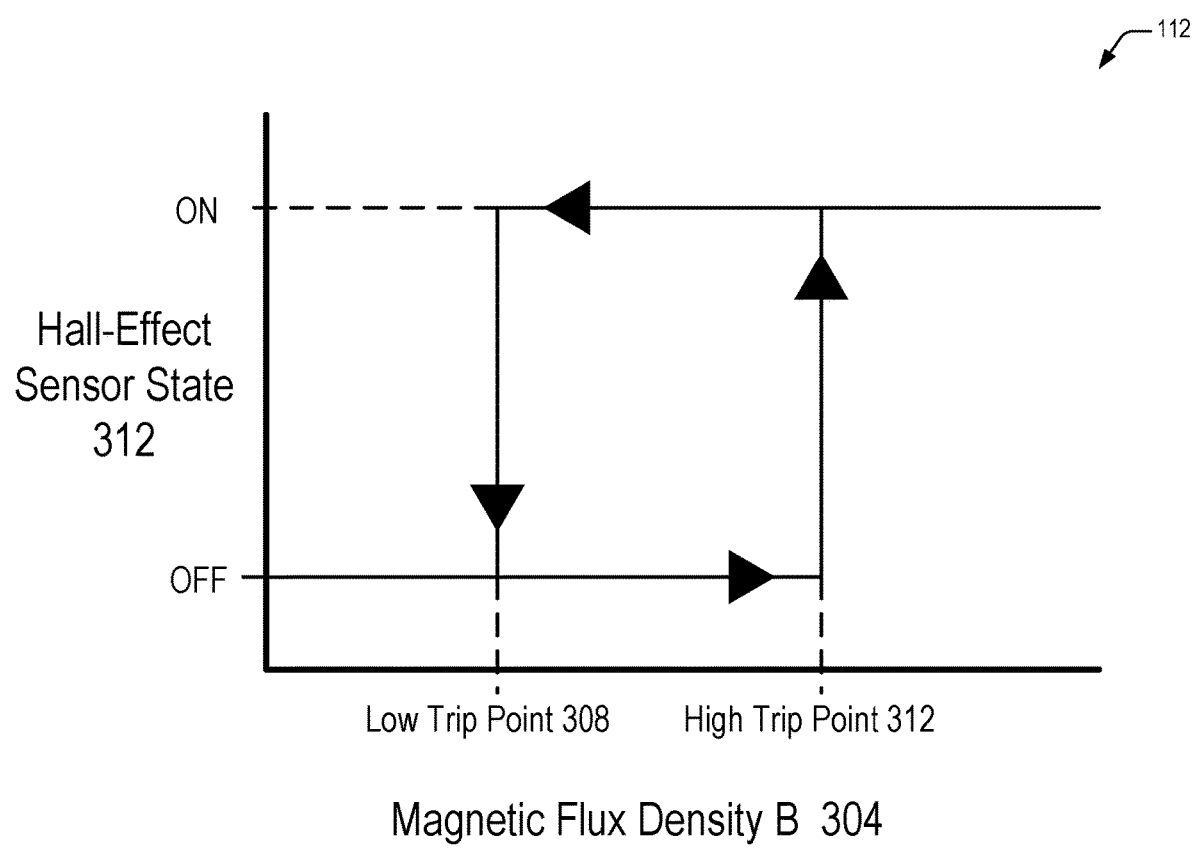
FIG. 3 is a diagram illustrating conventional hall-effect sensor hysteresis behavior in accordance with embodiments of the present application.

Referring now to FIG. 3, a diagram illustrating conventional hall-effect sensor hysteresis behavior in accordance with embodiments of the present application is shown. FIG. 3 illustrates a conventional hall-effect sensor state 312 as a function of magnetic flux density B 304 at the hall-effect sensor 112, when the hall-effect sensor 112 is powered by a conventional steady DC power source.

Hall-effect sensors 112 typically include a Schmitt trigger with built-in hysteresis connected to an internal op-amp. When a magnetic flux passing through the Hall-effect sensor 112 exceeds a pre-set value (high trip point 312) the state 312 switches quickly between its "OFF" state to an "ON" state without any type of contact bounce. This built-in hysteresis eliminates any oscillation of the output signal 144 as the sensor moves in and out of the magnetic field. Similarly, when a magnetic flux passing through the Hall-effect sensor 112 falls below a pre-set value (low trip point 308) the state 312 switches quickly between its "ON" state to an "OFF" state.

However, for the present application the built-in hysteresis of conventional hall-effect sensors 112 presents a problem. For example, a hall-effect sensor 112 may trip in the presence of a field-strength of 5.5 milliTeslas (high trip point 312), and not release again until the field-strength drops below 5.0 milliTeslas (low trip point 308). This presents a practical problem because typically, the desire is to bias this example-sensor up into some region between 5.0 and 5.5 milliTeslas in order to achieve the desired increase in sensitivity. In this case, the hall-effect sensor 112 would trip—but would never release (i.e., to an OFF hall-effect sensor state 312) because it would have been biased up to a field-strength higher than its release (i.e., high trip point 312). A means of having the hall-effect sensor state 312 release precisely when the permanent magnet 104 leaves the sensing area is needed.

Review of typical hall-effect proximity sensors reveals both an open-drain architecture as well as extremely high activation speeds: typically in the tens of microseconds. In order to address the hall-effect sensor 112 latch-up problem due to hysteresis, the present application turns the hall-effect sensor 112 on and off "very rapidly". In this case, two things occur: as the permanent magnet 104 ingresses into the field of the radially-wound coil 108, the hall-effect sensor 112 trips—first, at its threshold level and again & again while the field strength continues to grow. (i.e., while the magnet 104 continues ingressing). When the permanent magnet 104 egresses from the field of the radially-wound coil 108, the hall-effect sensor 112 releases when it can no longer "turn on"—because the sympathetic permanent magnet 104 has been removed from the sensing area. In other applications, hall-effect sensors may latch-up if the magnetic coil is biased until it produces a field strength higher that the release-point of the hall effect sensor. It is only in this case that any magnet leaving the region would not result in a release, because of the bias current in the magnetic coil. This additionally produces another beneficial effect: the turn-on and turn-off sensitivities of the hall-effect sensor 112 are identical, thus eliminating the asymmetrical (hysteresis) nature of the conventional hall-effect sensor operation.

In order to turn the hall-effect sensor 112 on & off (at a rate of tens of microseconds), a square-wave oscillator is employed—acting as power source 116. When power is removed from the hall-effect sensor 112, the hall-effect sensor 112 cannot activate and the output of the circuit pulls up to the supply voltage rail. In the preferred embodiment, the power source 116 provides power at approximately a 4 Kilohertz (KHz) frequency.

When power 116 is applied to the hall-effect sensor 112 there are two possibilities. If there is a (sympathetically aligned) permanent magnet 104 in close proximity to the hall-effect sensor 112, the hall-effect sensor 112 activates—whereas if the (sympathetically-aligned) permanent magnet 104 is outside of the hall-effect sensor 112 field, then the hall-effect sensor 112 does not activate. Decoupling capacitance is needed in order to produce smooth operation of the hall-effect sensor 112 while its power supply 116 voltage is applied and removed rapidly.

Advantageously, this combination of power source 116 and hall-effect sensor 112 allows a very small magnet 104 to trip the hall-effect sensor 112 and for the hall-effect sensor 112 to be able to release (when the magnet 104 leaves the sensing area) far above the hall-effect sensor's 112 normal hysteresis level. This operates the hall-effect sensor 112 (on AND off) far above the usual turn-off level. This key feature is what permits detection of tiny magnets 104 at large distances.

Therefore, an advantage of the present application is that it alleviates hysteresis disadvantages of conventional hall-effect sensors when powered by conventional steady DC power sources. Because of hysteresis, conventional hall-effect sensors remain in a "latch up" or activated output condition long after a magnet has left a sensing area. Hall-effect sensors may latch-up if the magnetic coil is biased until it produces a field strength higher that the release-point of the hall effect sensor. It is only in this case that any magnet leaving the region would not result in a release, because of the bias current in the magnetic coil. This may result in inaccurate magnet detection and provide misleading information with respect to timing. The present application utilizes a varying power source that prevents a hall-effect sensor from remaining in a "latch up" condition due to internal hysteresis.

Figure 4A:
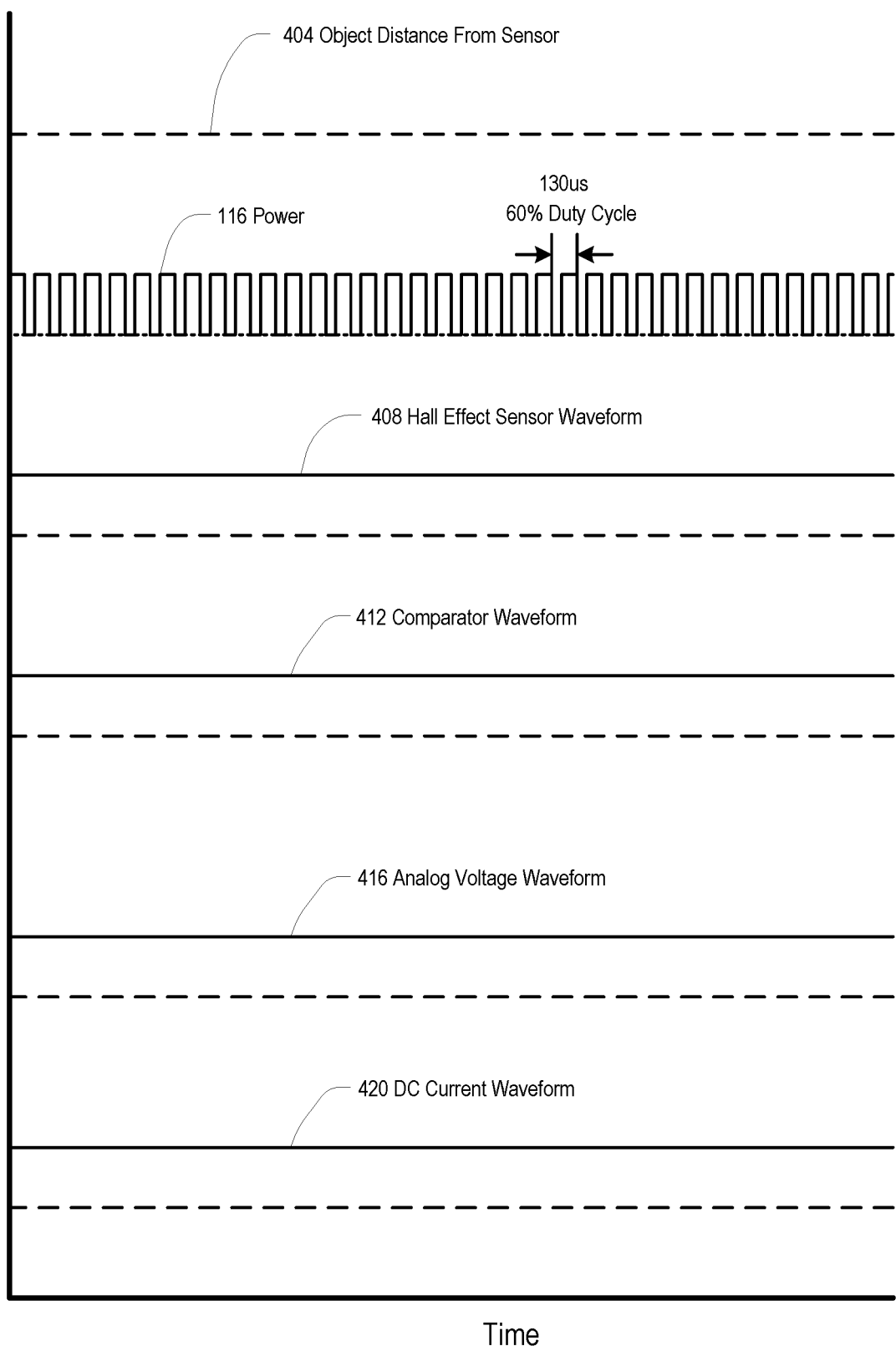
FIG. 4A is a diagram illustrating unipolar signal propagation when no object is detected, in accordance with embodiments of the present application.

Referring now to FIG. 4A, a diagram illustrating unipolar signal propagation when no object is detected in accordance with embodiments of the present application is shown. FIG. 4A illustrates a case where no magnet 104 or object is detected by the sense circuit 148, in order to provide a corresponding description for other critical signals under those conditions.

The device may be configured to operate with either unipolar sensing or omnipolar sensing. Unipolar sensing is magnet sensing using only a single magnetic polarity at all times. This means that the first magnetic field produced by the radially-wound coil 108 has a defined north orientation that does not change. Although a unipolar arrangement is potentially simpler and less expensive than other configurations (omnipolar, for example), it has a major disadvantage. It may be less effective for sensing magnets 104 having a second magnetic field with a different or opposite polarity as the first magnetic field. However, if one understands that all magnets 104 (or at least magnets 104 that one was concerned about) had the same or a similar polarity as the first magnetic field, then the unipolar configuration would likely be simpler and less complex than other alternatives.

The top waveform illustrates no object (magnet 104) within a detection distance 404 from the hall-effect sensor 112. The power 116 provides a modulated power input to the hall-effect sensor 112 that provides power according to a fixed frequency and duty cycle. In the preferred embodiment, the power 116 has a 130 microsecond period (7.692 KHz) with a 60% duty cycle. This corresponds to an "on time" of 78 microseconds alternated with an "off time" of 52 microseconds. Thus, the hall-effect sensor 112 is pulsed with a power input between on and off states 312. The hall-effect sensor 112 only operates when it is receiving power 116. Advantageously, pulsing the power significantly reduces both power consumption and heat generation while not inhibiting magnet 104 detection. Even magnets 104 moving at relatively high velocities may be detected by pulsing power 116 to the hall-effect sensor 112 at a high rate. However, in spite of the advantages associated with pulsing power 116 to the hall-effect sensor 112, the present application includes embodiments where either the power 116 may be constant and not pulsed, or pulsed at a different rate than specifically described.

The hall-effect sensor waveform 408 and the comparator waveform 412 do not provide an indication of detecting the magnet 104, since a magnet 104 is not present. Because the device is configured with unipolar sensing, the analog voltage waveform 416 and the DC current waveform 420 are steady and unchanging.

Another advantage of the present application is it provides a simplified apparatus and construction for sensing magnets with a known and repeatable orientation. By using a unipolar sensor configuration, such magnets may be reliably detected while simplifying operation of the control circuit.

Figure 4B:
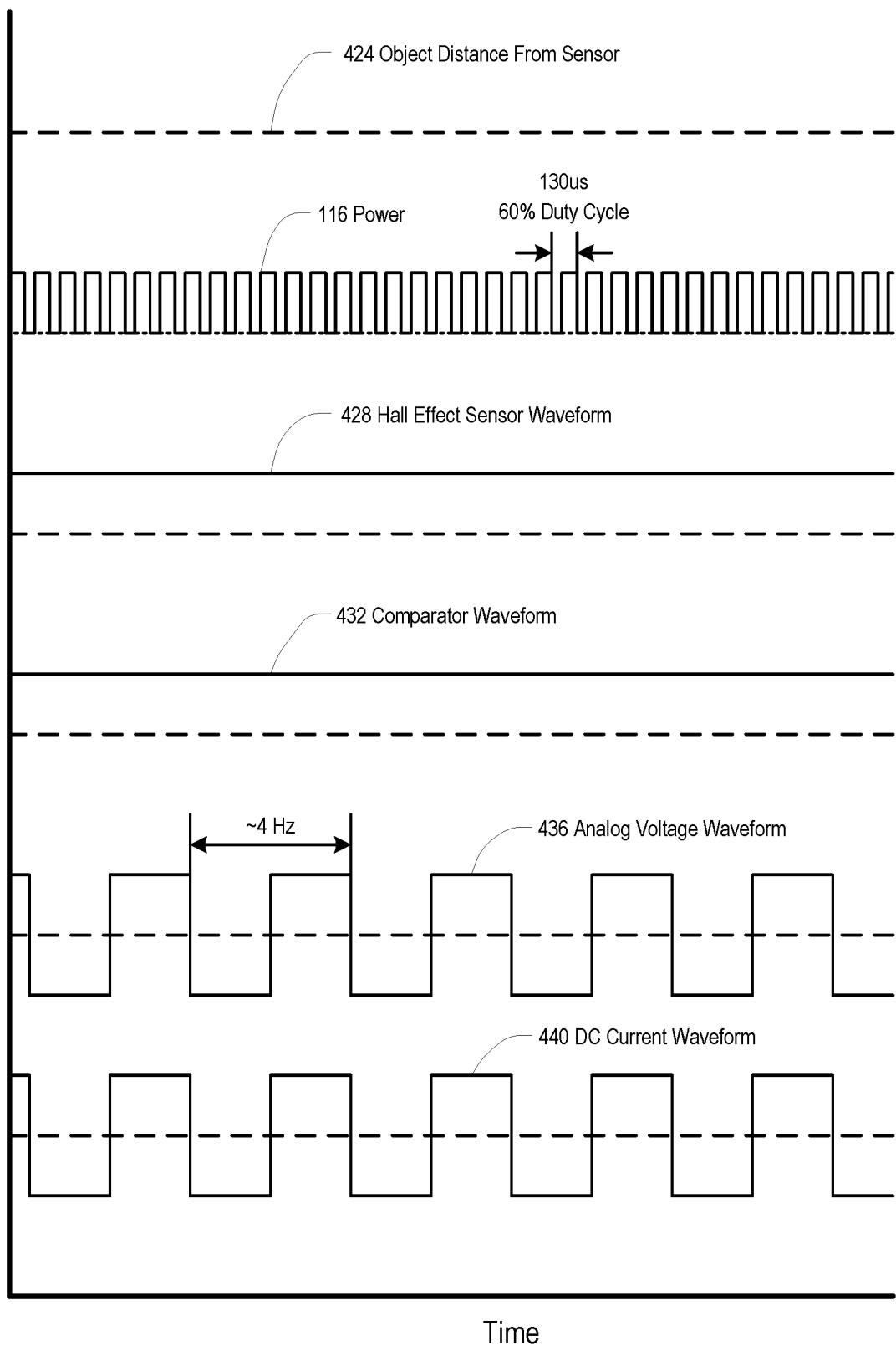
FIG. 4B is a diagram illustrating omnipolar signal propagation when no object is detected, in accordance with embodiments of the present application.

Referring now to FIG. 4B, a diagram illustrating omnipolar signal propagation when no object is detected in accordance with embodiments of the present application is shown. FIG. 4B illustrates a case where no magnet 104 or object is detected by the sense circuit 148, in order to provide a corresponding description for other critical signals under those conditions.

Omnipolar sensing is magnet sensing using a dual magnetic polarity. This means that the first magnetic field produced by the radially-wound coil 108 has an alternating north and south orientation. Omnipolar sensing requires an alternating DC current 140 to the radially-wound coil 108.

The top waveform illustrates no object (magnet 104) within a detection distance 424 from the hall-effect sensor 112. The power source 116 provides a modulated power input to the hall-effect sensor 112, as described with reference to FIG. 4A.

The hall-effect sensor waveform 428 and the comparator waveform 432 do not provide an indication of detecting the magnet 104. Because the device is configured with omnipolar sensing, the analog voltage waveform 436 and the DC current waveform 440 are alternating waveforms when a magnet 104 is not detected.

The analog voltage waveform 436 and the DC current waveform 440 alternate between a positive and a negative value in order to reverse the first magnetic field from the radially-wound coil 108. This has a major advantage when the polarity of the magnet 104 is unknown, unpredictable, or likely to change. The effect of this is described in more detail with respect to FIGS. 7A-7D. The rate of change for the analog voltage waveform 436 and the DC current waveform 440 in the preferred embodiment is approximately 4 Hz. However, in other embodiments it may be greater than or less than 4 Hz, as long as magnets 104 move at a velocity that allows for reliable detection.

An advantage of the present application is it provides an ability to detect magnets either having any conceivable orientation/polarity. When a sensing circuit is configured in an omnipolar configuration, a magnetic field with alternating polarity is produced. The magnetic field alternates between first and second (opposite to first) polarity and provides the greatest sensing sensitivity when a sympathetic field to the magnet is produced.

Figure 5A:
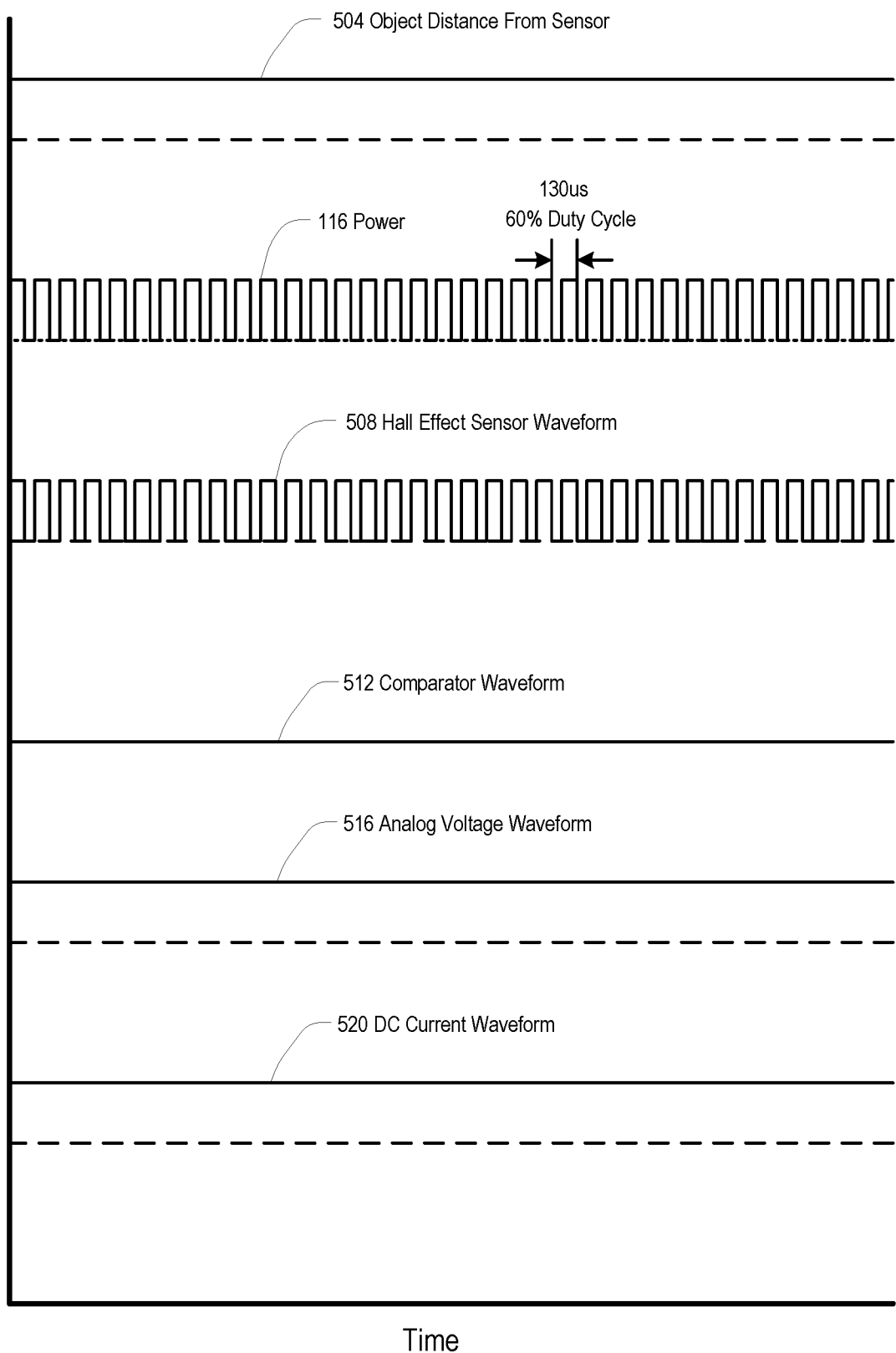
FIG. 5A is a diagram illustrating unipolar signal propagation when an object is at a fixed detected distance, in accordance with embodiments of the present application.

Referring now to FIG. 5A, a diagram illustrating unipolar signal propagation when an object is detected at a fixed distance d in accordance with embodiments of the present application is shown. FIG. 5A illustrates a case where a magnet 104 or object is detected by the sense circuit 148, in order to provide a corresponding description for other critical signals under those conditions.

The top waveform illustrates an object (magnet 104) at a fixed detection distance 504 from the hall-effect sensor 112. The power source 116 provides a modulated power input to the hall-effect sensor 112, as described with reference to FIG. 4A.

The hall-effect sensor waveform 508 and the comparator waveform 512 each provide an indication of detecting the magnet 104. In the example shown, the comparator waveform 512 is an active-low signal and therefore remains in the "low" state while the magnet 104 is being detected. Because the device is configured with unipolar sensing, the analog voltage waveform 516 and the DC current waveform 520 are steady and unchanging.

Figure 5B:
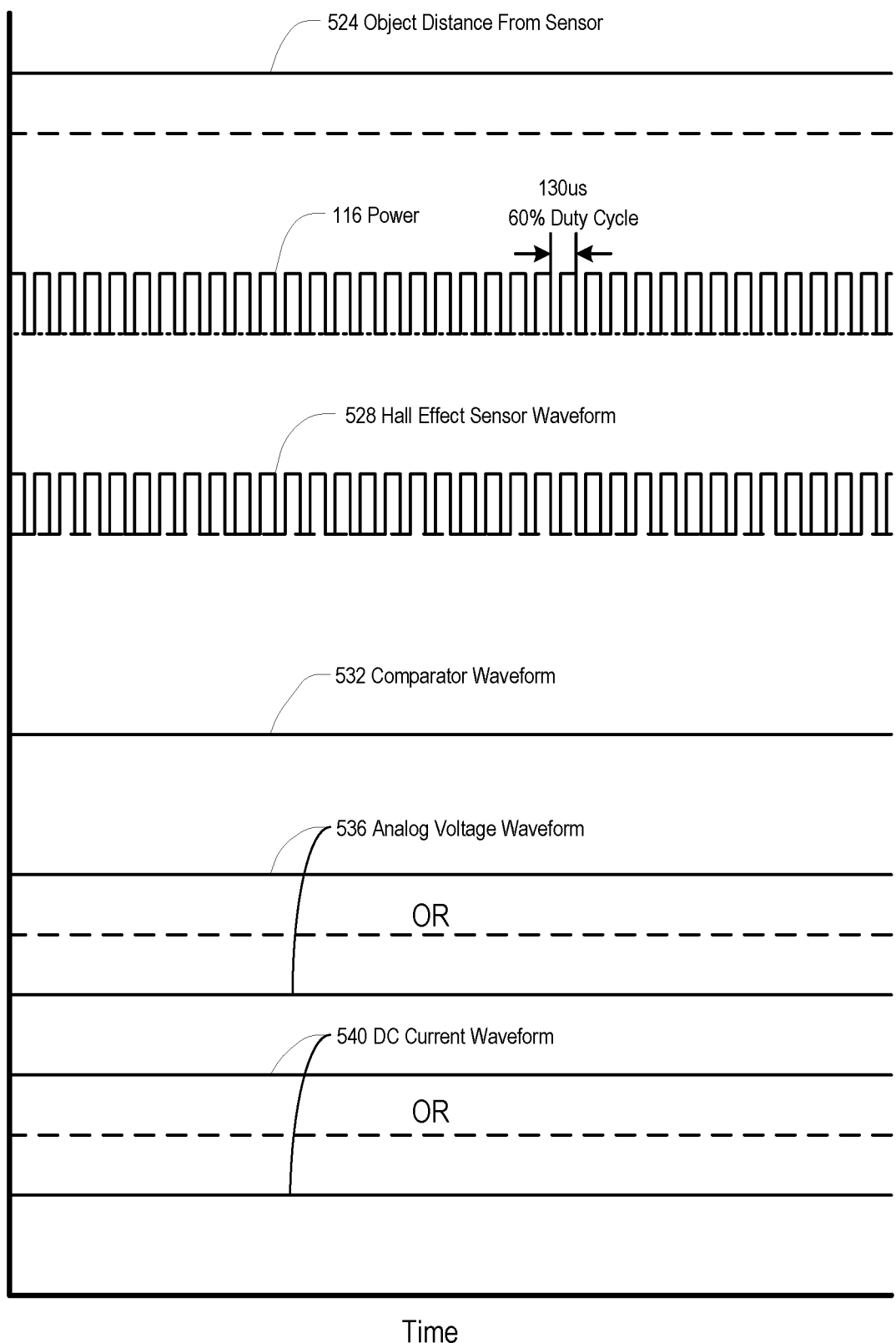
FIG. 5B is a diagram illustrating omnipolar signal propagation when an object is at a fixed detected distance, in accordance with embodiments of the present application.

Referring now to FIG. 5B, a diagram illustrating omnipolar signal propagation when an object is detected at a fixed distance d in accordance with embodiments of the present application is shown. FIG. 5B illustrates a case where a magnet 104 or object is detected by the sense circuit 148, in order to provide a corresponding description for other critical signals under those conditions.

The top waveform illustrates an object (magnet 104) at a fixed detection distance 524 from the hall-effect sensor 112. The power source 116 provides a modulated power input to the hall-effect sensor 112, as described with reference to FIG. 4A.

Figure 7A:
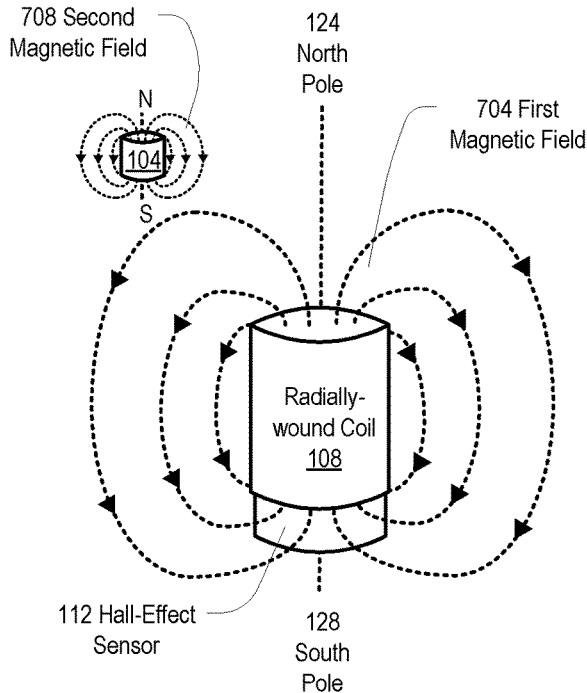
FIG. 7A is a diagram illustrating magnetic object detection in fully sympathetic magnetic fields, in accordance with embodiments of the present application.
Figure 7A:
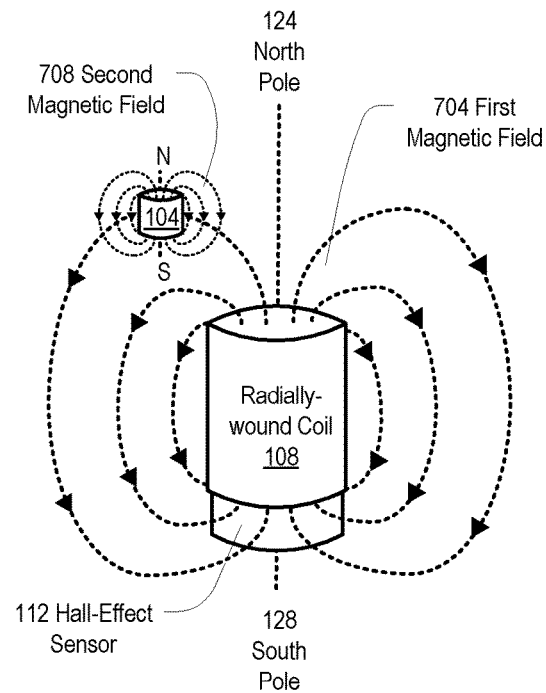
Figure 7A:
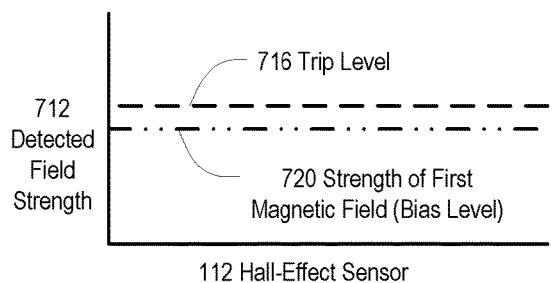
Figure 7A:
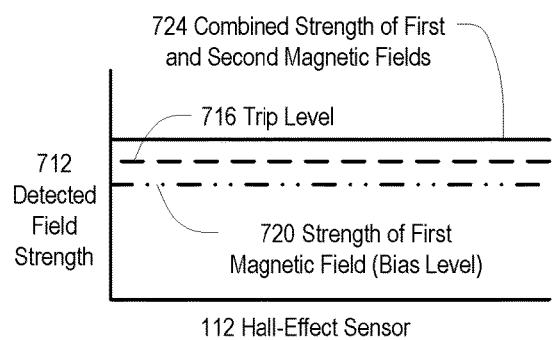

The hall-effect sensor waveform 528 and the comparator waveform 532 each provide an indication of detecting the magnet 104. Because the device is configured with omnipolar sensing, the analog voltage waveform 536 and the DC current waveform 540 are constant and unchanging waveforms when a magnet 104 is detected. However, the analog voltage waveform 536 and the DC current waveform 540 are both either positive or negative while the magnet 104 is detected. The reason for that has to do with sympathetic polarities between the first and second magnetic fields. Referring to FIGS. 7A and 7D, sympathetic magnetic fields are required in order to detect a magnet 104 since the second magnetic field 708 produced by the magnet 104 must add enough to the bias level for the first magnetic field 704 to exceed the trip level 716 for the hall-effect sensor 112. Once a magnet 104 is initially detected (this occurs prior to the waveforms in FIG. 5B), the first magnetic field 704 polarity should not change until the magnet 104 is no longer detected—since changing it will result in the bias level 720 changing and the magnet 104 will no longer be detected. Thus, if the DC current 140 was "positive" when the magnet 104 was initially detected, it needs to remain "positive" in order for the second magnetic field 708 to add enough to the bias level 720 to cause the trip level 716 to be exceeded. Similarly, if the DC current 140 was "negative" when the magnet 104 was initially detected, it needs to remain "negative" in order for the second magnetic field 708 to add enough to the bias level 720 to cause the trip level 716 to be exceeded.

Figure 6A:
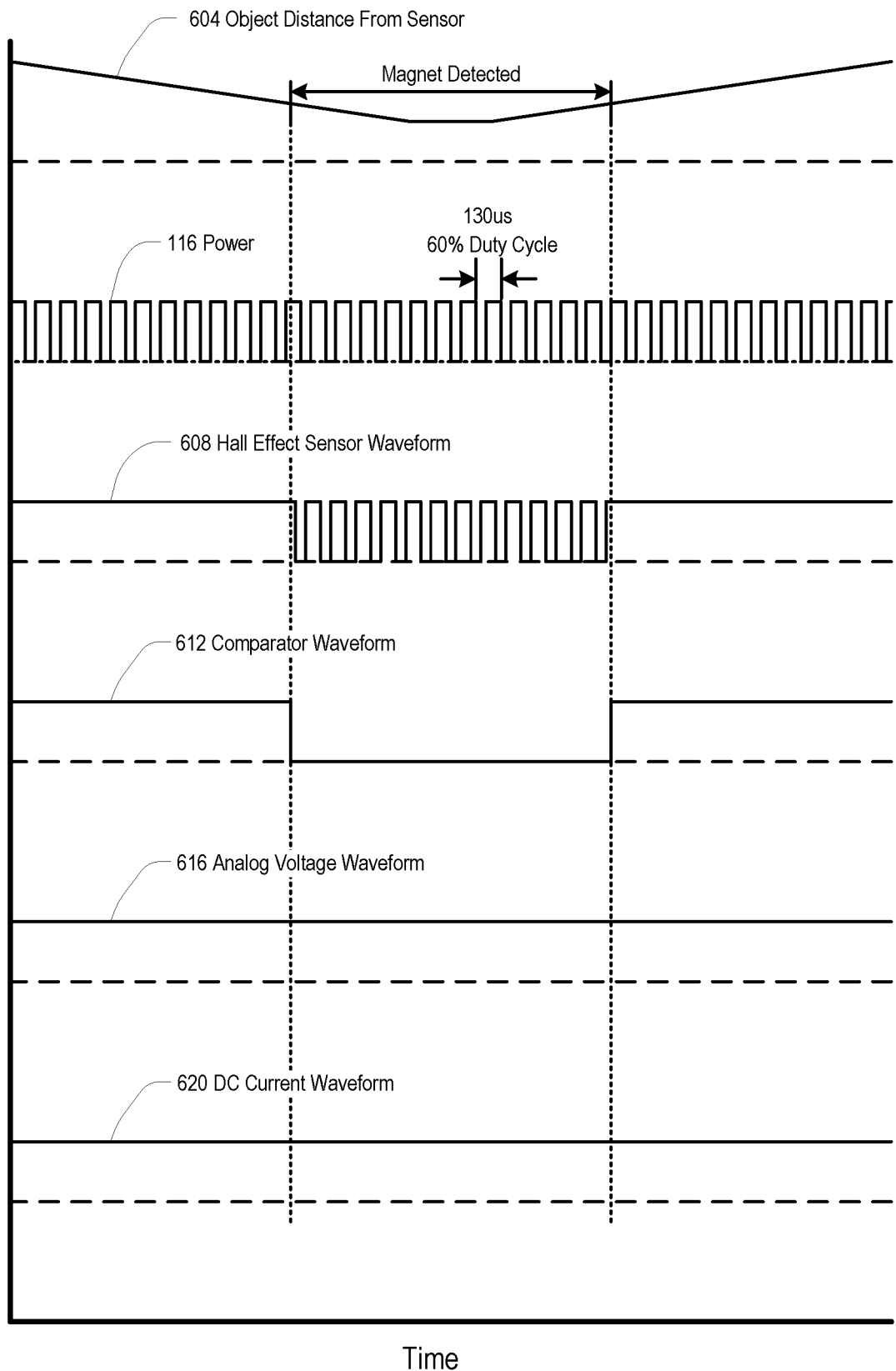
FIG. 6A is a diagram illustrating unipolar signal propagation when an object is moving toward a sensor, then away, in accordance with embodiments of the present application.

Referring now to FIG. 6A, a diagram illustrating unipolar signal propagation when an object is moving toward a sensor then away in accordance with embodiments of the present application is shown. FIG. 6A illustrates a case where a magnet 104 or object is initially detected by the sense circuit 148, then moves out of detection, in order to provide a corresponding description for other critical signals under those conditions.

The top waveform illustrates an object (magnet 104) at a variable detection distance 604 from the hall-effect sensor 112. The magnet 104 initially is at a greater distance than distance 604 from the hall-effect sensor 112, and the hall-effect sensor 112 does not detect the magnet 104. As the magnet 104 moves closer to the hall-effect sensor 112, the magnet 104 may be detected at some point. In some cases, this may be when at a detection distance d 132. However, if the magnet 104 is not fully sympathetically aligned with the first magnetic field 704 (i.e. reflected in FIGS. 7C-7D), it may need to be closer than distance d 132 in order to be detected. Finally, the magnet 104 moves beyond a distance d 132 and is no longer detected. The power source 116 provides a modulated power input to the hall-effect sensor 112, as described with reference to FIG. 4A.

The hall-effect sensor waveform 608 and the comparator waveform 612 each provide a negative indication of detecting the magnet 104 both before the magnet 104 is detected and after the magnet 104 is no longer detected. However, while the magnet 104 is detected, the hall-effect sensor output 144 indicates a modulated waveform 608 with similar characteristics to the power source 116. Because of the low-pass filter 204 and the comparator 208, the waveform is "cleaned up" so that a clean comparator waveform 612 is produced to the processor 212. Because this is a unipolar sensing case, the analog voltage waveform 616 and the DC current waveform 620 are steady and unchanging.

Figure 6B:
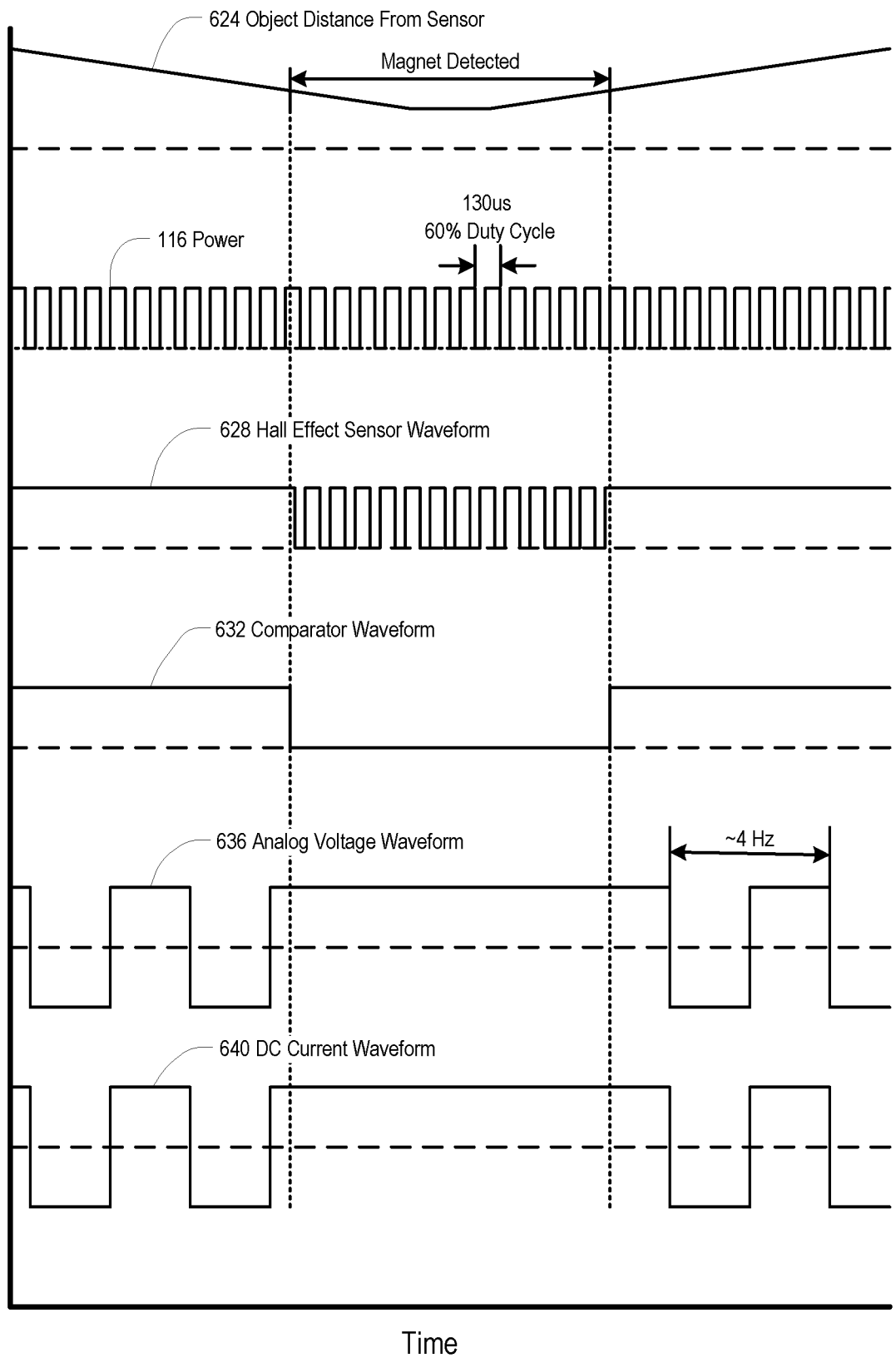
FIG. 6B is a diagram illustrating omnipolar signal propagation when an object is moving toward a sensor, then away, in accordance with a first embodiment of the present application.

Referring now to FIG. 6B, a diagram illustrating omnipolar signal propagation when an object is moving toward a sensor then away in accordance with embodiments of the present application is shown. FIG. 6B illustrates a case where a magnet 104 or object is initially detected by the sense circuit 148, then moves out of detection, in order to provide a corresponding description for other critical signals under those conditions.

The top waveform illustrates an object (magnet 104) at a variable detection distance 624 from the hall-effect sensor 112. The magnet 104 initially is at a greater distance than distance d 132 from the hall-effect sensor 112, and the hall-effect sensor 112 does not detect the magnet 104. As the magnet 104 moves closer to the hall-effect sensor 112, the magnet 104 is detected. In some cases, this may be when at a detection distance d 132. However, if the magnet 104 is not fully sympathetically aligned with the first magnetic field 704 (i.e. reflected in FIGS. 7C-7D), it may need to be closer than distance d 132 in order to be detected. Finally, the magnet 104 moves beyond distance d 132 and is no longer detected. The power source 116 provides a modulated power input to the hall-effect sensor 112, as described with reference to FIG. 4A.

The hall-effect sensor waveform 628 and the comparator waveform 632 each provide a negative indication of detecting the magnet 104 both before the magnet 104 is detected and after the magnet 104 is no longer detected. However, while the magnet 104 is detected, the hall-effect sensor waveform 628 indicates a modulated waveform with similar characteristics to the power source 116. Because of the low-pass filter 204 and the comparator 208, the waveform is "cleaned up" so that a clean comparator waveform 632 is produced to the processor 212.

The analog voltage waveform 636 and the DC current waveform 640 are each alternating waveforms when the magnet 104 is not detected, as described with reference to FIG. 4B. At the time the magnet 104 is first detected, both the analog voltage waveform 636 and the DC current waveform 640 happen to have positive values. As described with reference to FIG. 5B, whatever positive (or negative) value the analog voltage waveform 636 and the DC current waveform 640 have when the magnet 104 is first detected is maintained while the hall-effect sensor 112 still detects the magnet 104. This is because only sympathetic first (radially-wound coil 108) and second (magnet 104) magnetic fields are able to exceed the trip level 716 for the hall-effect sensor 112.

Figure 6C:
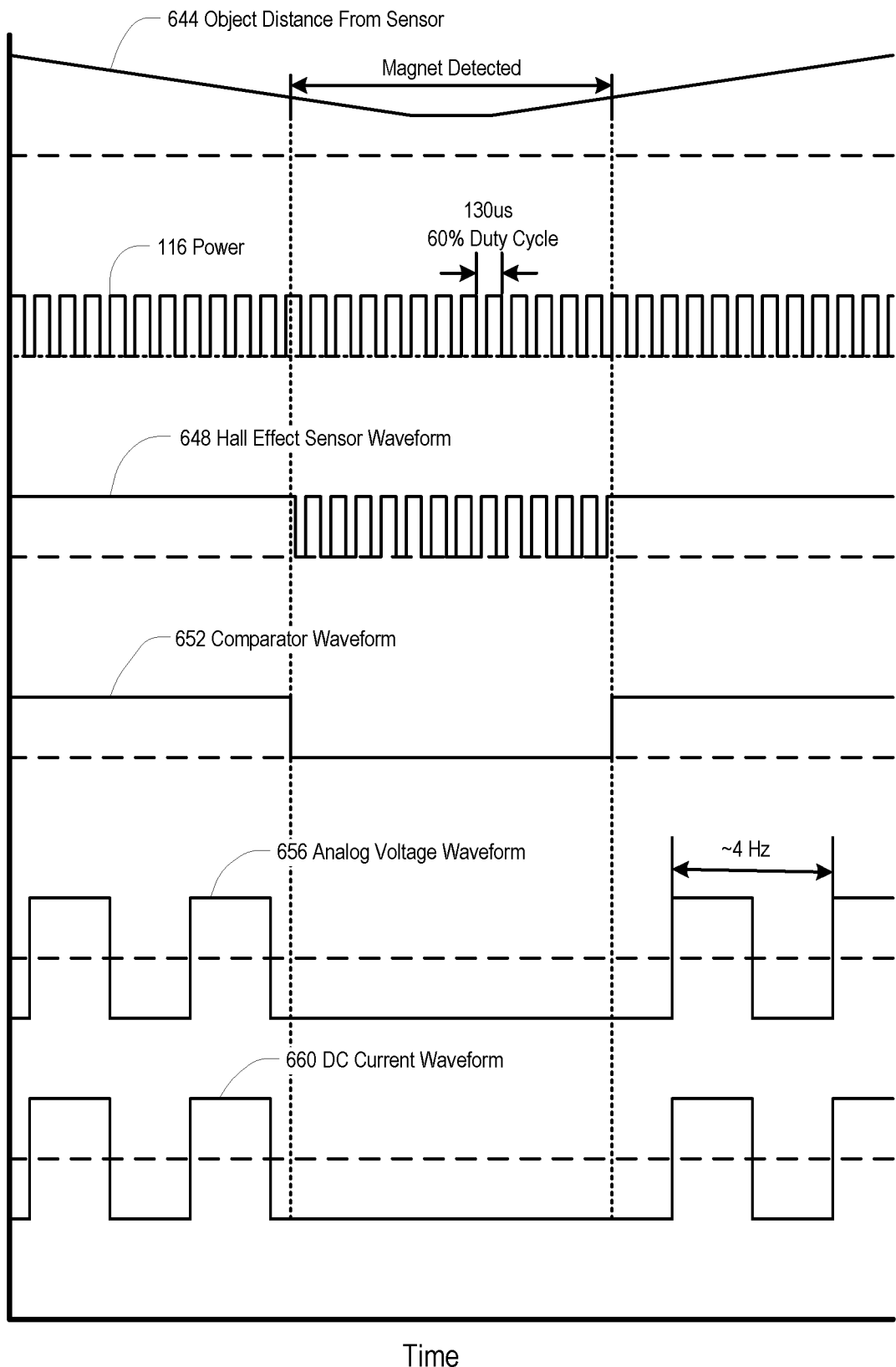
FIG. 6C is a diagram illustrating omnipolar signal propagation when an object is moving toward a sensor, then away, in accordance with a second embodiment of the present application.

Referring now to FIG. 6C, a diagram illustrating omnipolar signal propagation when an object is moving toward a sensor then away in accordance with embodiments of the present application is shown. FIG. 6C illustrates a case where a magnet 104 or object is initially detected by the sense circuit 148, then moves out of detection, in order to provide a corresponding description for other critical signals under those conditions. FIG. 6C is identical to FIG. 6B but reflects a case where, at the time the magnet 104 is first detected, both the analog voltage waveform 656 and DC current waveform 660 happen to have negative (instead of positive per FIG. 6B) values. As described with reference to FIG. 5B, whatever positive (or negative) value the analog voltage waveform 656 and the DC current waveform 660 have when the magnet 104 is first detected is maintained while the hall-effect sensor 112 still detects the magnet 104. This is because only sympathetic first (radially-wound coil 108) and second (magnet 104) magnetic fields are able to exceed the trip level 716 for the hall-effect sensor 112. Therefore, both the analog voltage waveform 656 and the DC current waveform 660 maintain the "negative" values during magnet 104 detection.

Referring now to FIG. 7A, a diagram illustrating magnetic object detection in fully sympathetic magnetic fields, in accordance with embodiments of the present application is shown.

The present application describes a magnet 104 sensing technique based on a bias level 720 and a slightly higher trip level 716. The second magnetic field 708 from the magnet 104 is what causes the trip level 716 to be exceeded. FIGS. 7A-7D describe several cases where the trip level 716 is or is not exceeded, based on polar orientations of the first 704 and the second 708 magnetic fields. Although the examples illustrated in FIGS. 7A-7D only show the first magnetic field 704 when in a "positive" polarity of an omnipolar sensing configuration (corresponding to positive values of the analog voltage waveform 436 and the DC current waveform 440 in FIG. 4B), it should be understood that the first magnetic field 704 has a "negative" polarity (corresponding to negative values of the analog voltage waveform 436 and the DC current waveform 440 in FIG. 4B) approximately half the time for omnipolar configurations.

FIG. 7A illustrates a case where a magnet 104 enters a fully sympathetic magnetic field (first magnetic field 704) of the radially-wound coil 108. The illustration in FIG. 7A applies to both unipolar and omnipolar sensing, but only illustrates the omnipolar case where the first magnetic field 704 has a positive polarity (i.e. where the north pole 124 extends toward the magnet 104, and the south pole 128 extends away from the magnet 104) and the polarity of the first magnetic field 704 matches the polarity of the second magnetic field 708.

The left side of FIG. 7A reflects the hall-effect sensor 112 does not detect the magnet 104. Even though the first 704 and second 708 magnetic fields are sympathetically aligned, the hall-effect sensor 112 does not detect the magnet 104 because the combination (sum) of the first magnetic field 704 and the second magnetic field 708 at the hall-effect sensor 112 does not exceed the trip level 716. This case may correspond to the magnet 104 polarity-aligned with the radially-wound coil 108 but at a distance greater than distance d 132 the hall-effect sensor can detect, or a weaker magnet 104 not able to be detected by the hall-effect sensor 112.

The diagram in the lower left of FIG. 7A corresponds with the detection case in the upper left of FIG. 7A. Therefore, the detected field strength 712 (i.e. combination of the first 704 and second 708 magnetic fields) does not exceed the trip level 716 for the hall-effect sensor 112. Because the trip level 716 has not been exceeded, the sensor output 144 is static—reflecting no magnet 104 detected.

The right side of FIG. 7A reflects the hall-effect sensor 112 detects the magnet 104 since the magnet 104 has moved into a detection distance. Because the first 704 and second 708 magnetic fields are sympathetically aligned, the hall-effect sensor 112 detects the magnet 104 because the combination (sum) of the first magnetic field 704 and the second magnetic field 708 at the hall-effect sensor 112 exceeds the trip level 716. This case may correspond to the magnet 104 polarity-aligned with the radially-wound coil 108 and within a distance d 132 for the hall-effect sensor, or a stronger magnet 104 able to be detected by the hall-effect sensor 112.

The diagram in the lower right of FIG. 7A corresponds with the detection case in the upper right of FIG. 7A. Therefore, the detected field strength 712 (i.e. combined strength 724 of the first 704 and second 708 magnetic fields) exceeds the trip level 716 for the hall-effect sensor 112. Because the trip level 716 has been exceeded, the sensor output 144 is active—reflecting the magnet 104 is detected.

An advantage of the present application is that it provides an apparatus to accurately sense proximity of small magnets without requiring high DC current levels. A combination of a matched radially-wound coil 108 and a hall-effect sensor 112 with an adjustable control circuit 120 biases the hall-effect sensor close to the trip level 716. A relatively weak magnetic field 708 from a magnet 104 causes the trip level 716 to be exceeded and the magnet 104 to be detected.

Figure 7B:
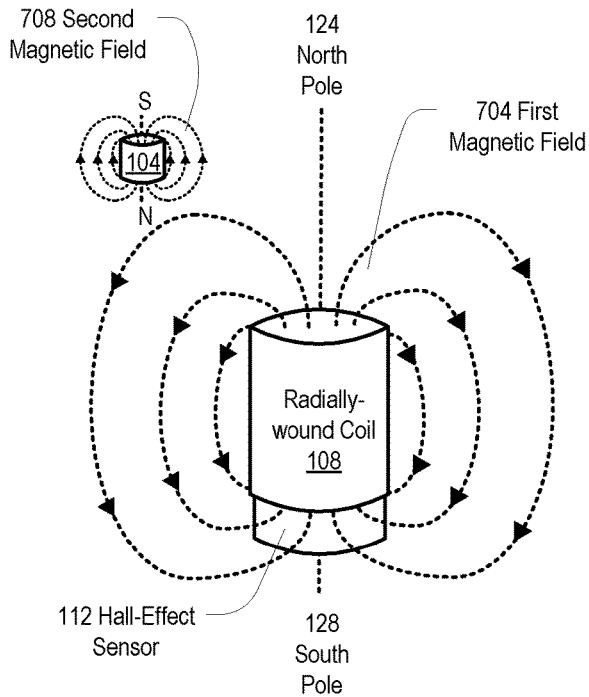
FIG. 7B is a diagram illustrating magnetic object non-detection in fully non-sympathetic magnetic fields, in accordance with embodiments of the present application.
Figure 7B:
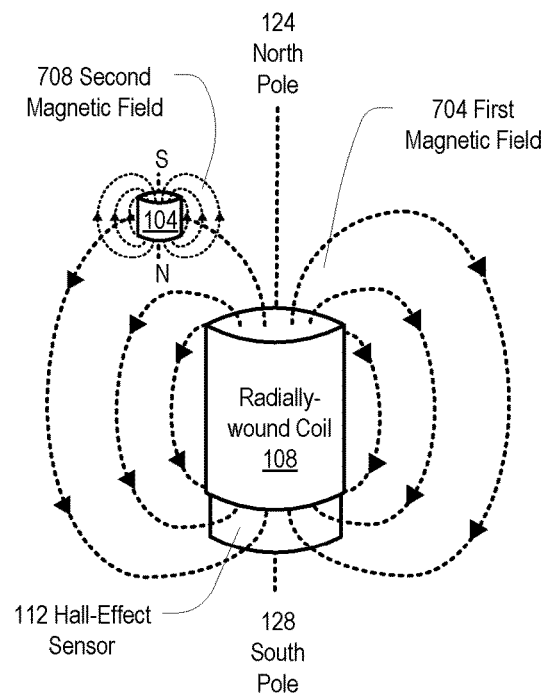
Figure 7B:
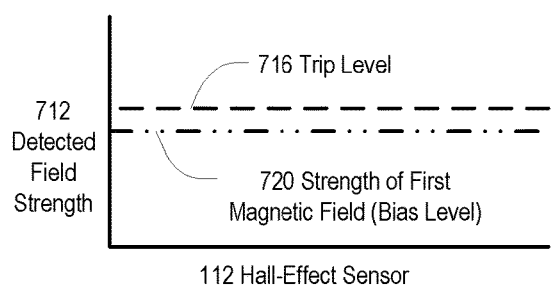
Figure 7B:
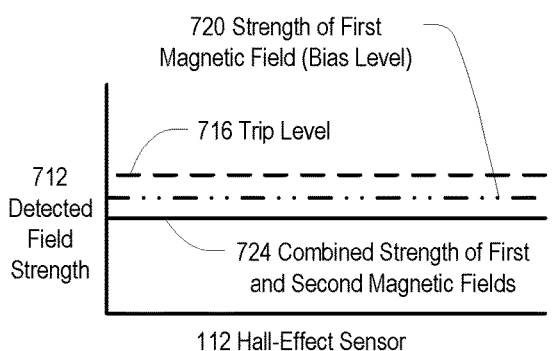

Referring now to FIG. 7B, a diagram illustrating magnetic object non-detection in fully non-sympathetic magnetic fields, in accordance with embodiments of the present application is shown. FIG. 7B illustrates a case where a magnet 104 enters a fully non-sympathetic magnetic field (first magnetic field 704) of the radially-wound coil 108. The illustration in FIG. 7B applies to both unipolar and omnipolar sensing, but only illustrates the omnipolar case where the first magnetic field 704 has a positive polarity (i.e. where the north pole 124 extends toward the magnet 104, and the south pole 128 extends away from the magnet 104) and the polarity of the first magnetic field 704 is directly opposite the polarity of the second magnetic field 708.

The left side of FIG. 7B reflects the hall-effect sensor 112 does not detect the magnet 104. The first 704 and second 708 magnetic fields are non-sympathetically aligned, and the hall-effect sensor 112 does not detect the magnet 104 because the combination (sum) of the first magnetic field 704 and the second magnetic field 708 at the hall-effect sensor 112 does not exceed the trip level 716. This case may correspond to the magnet 104 polarity-opposite with the radially-wound coil 108 and at a distance greater than distance d 132 the hall-effect sensor 112 can detect.

The diagram in the lower left of FIG. 7B corresponds with the detection case in the upper left of FIG. 7B. Therefore, the detected field strength 712 (i.e. combination of the first 704 and second 708 magnetic fields) does not exceed the trip level 716 for the hall-effect sensor 112. Because the trip level 716 has not been exceeded, the sensor output 144 is static—reflecting no magnet 104 detected. Moreover, because the polarities of the first 704 and second 708 magnetic fields are opposite, the second field strength 708 subtracts from the strength of the first magnetic field (bias level) 720, guaranteeing the hall-effect sensor 112 will not detect the magnet 104.

The right side of FIG. 7B reflects the hall-effect sensor 112 still does not detect the magnet 104, even though the magnet 104 has moved into a detection distance. Because the first 704 and second 708 magnetic fields are non-sympathetically aligned, the hall-effect sensor 112 cannot detect the magnet 104 because the combination (sum) of the first magnetic field 704 and the second magnetic field 708 at the hall-effect sensor 112 is less than the trip level 716.

The diagram in the lower right of FIG. 7B corresponds with the detection case in the upper right of FIG. 7B. Therefore, the detected field strength 712 (i.e. combined strength 724 of the first 704 and second 708 magnetic fields) is less than both the strength of the first magnetic field (bias level 720) and the trip level 716 for the hall-effect sensor 112. Because the trip level 716 has not been exceeded, the sensor output 144 is static—reflecting the magnet 104 has not been detected.

Figure 7C:
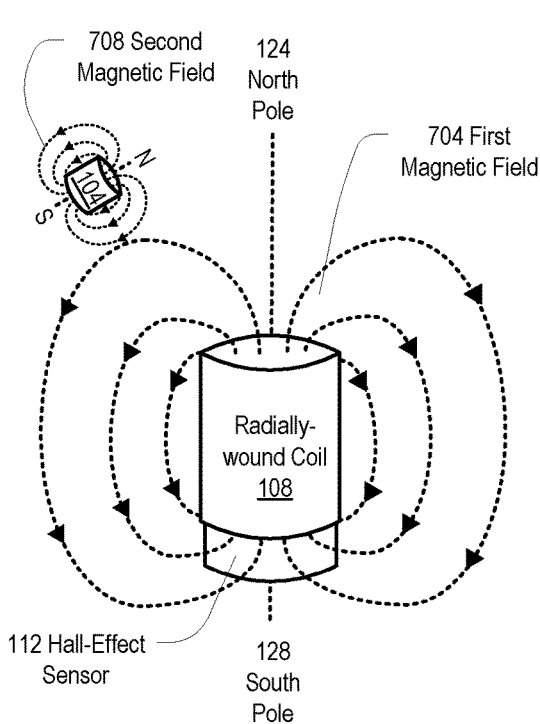
FIG. 7C is a diagram illustrating magnetic object non-detection in partially sympathetic magnetic fields, in accordance with embodiments of the present application.
Figure 7C:
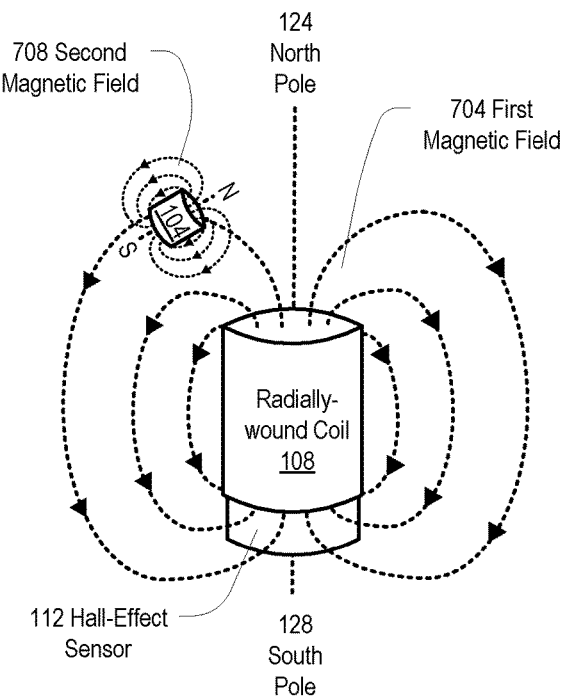
Figure 7C:
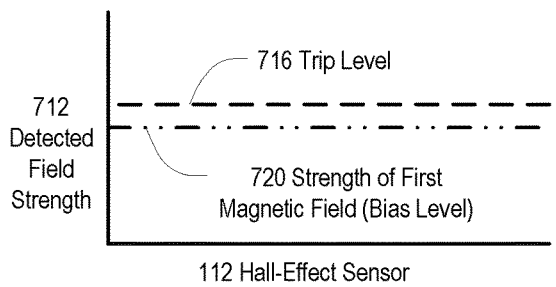
Figure 7C:
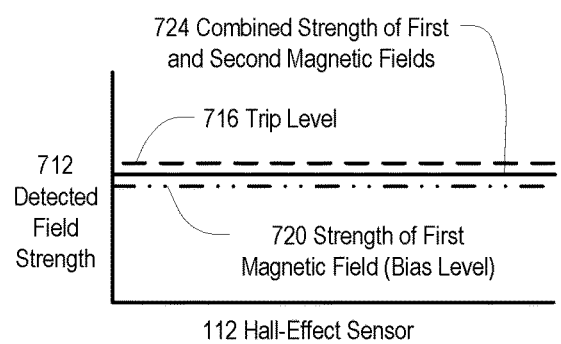
Figure 7D:
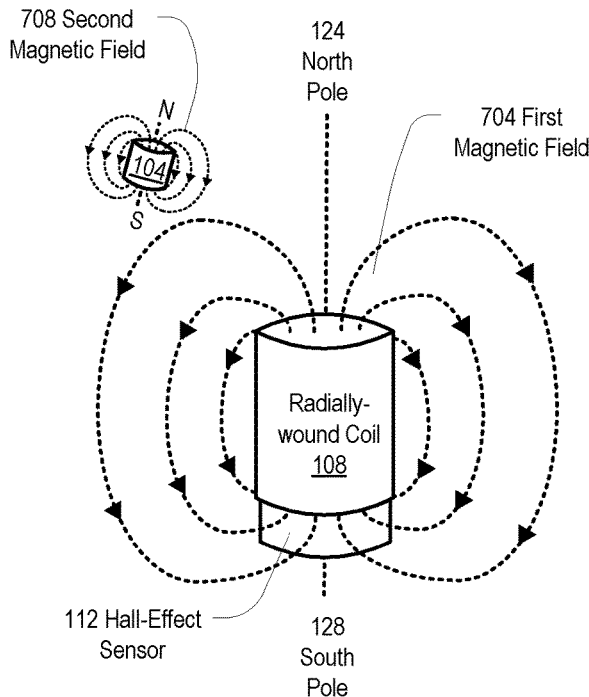
FIG. 7D is a diagram illustrating magnetic object detection in partially sympathetic magnetic fields, in accordance with embodiments of the present application.
Figure 7D:
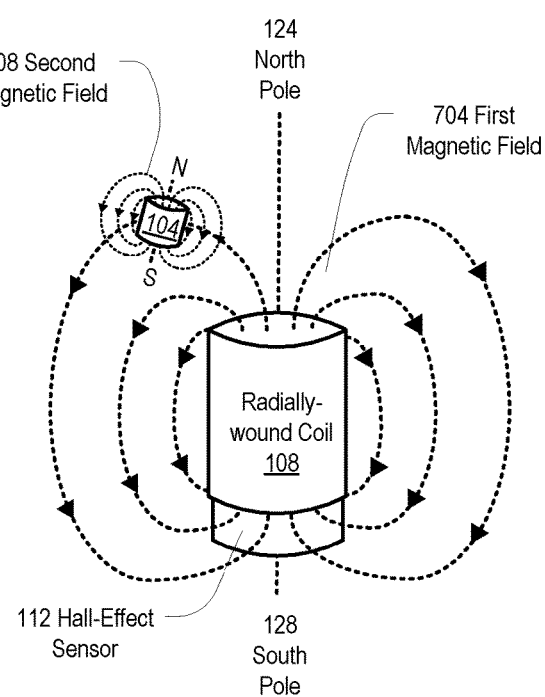
Figure 7D:
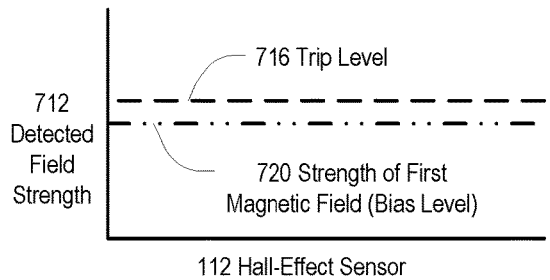
Figure 7D:
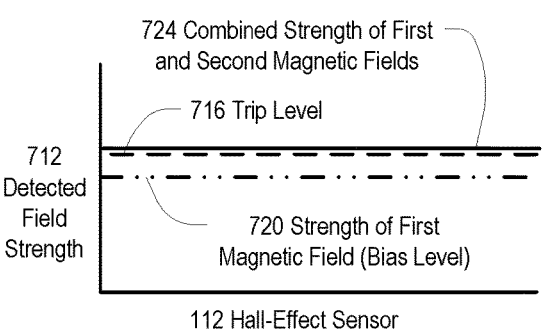

Referring now to FIG. 7C, a diagram illustrating magnetic object non-detection in partially sympathetic magnetic fields, in accordance with embodiments of the present application is shown. FIG. 7C illustrates a case where a magnet 104 enters a partially sympathetic magnetic field (first magnetic field 704) of the radially-wound coil 108. A partially sympathetic magnetic field where the first magnetic field 704 does not completely align or is completely opposed by the second magnetic field 708. In other words, there is an angular relationship between the first 704 and second 708 magnetic fields that is neither 0 nor 180 degrees. The partially sympathetic case illustrated in FIG. 7C applies to an angular relationship that contributes to the bias level 720, but not enough to exceed the trip level 716.

The illustration in FIG. 7C applies to both unipolar and omnipolar sensing, but only illustrates the omnipolar case where the first magnetic field 704 has a positive polarity (i.e. where the north pole 124 extends toward the magnet 104, and the south pole 128 extends away from the magnet 104) and the polarity of the first magnetic field 704 is directly opposite the polarity of the second magnetic field 708.

The left side of FIG. 7C reflects the hall-effect sensor 112 does not detect the magnet 104. The first 704 and second 708 magnetic fields are partially sympathetically aligned, and the hall-effect sensor 112 does not detect the magnet 104 because the combination (sum) of the first magnetic field 704 and the second magnetic field 708 at the hall-effect sensor 112 does not exceed the trip level 716. The angle of the magnet 104 relative to the radially-wound coil 108 only produces a minor contribution in addition to the bias level 720.

The diagram in the lower left of FIG. 7C corresponds with the detection case in the upper left of FIG. 7C. Therefore, the detected field strength 712 (i.e. combination of the first 704 and second 708 magnetic fields) does not exceed the trip level 716 for the hall-effect sensor 112. Because the trip level 716 has not been exceeded, the sensor output 144 is static—reflecting no magnet 104 detected.

The right side of FIG. 7C reflects the hall-effect sensor 112 still does not detect the magnet 104, even though the magnet 104 has moved into a detection distance. Because the first 704 and second 708 magnetic fields are only partially sympathetically aligned to a minor degree, the hall-effect sensor 112 cannot detect the magnet 104 because the combination (sum) of the first magnetic field 704 and the second magnetic field 708 at the hall-effect sensor 112 is less than the trip level 716.

The diagram in the lower right of FIG. 7C corresponds with the detection case in the upper right of FIG. 7C. Therefore, the detected field strength 712 (i.e. combined strength 724 of the first 704 and second 708 magnetic fields), although greater than the strength of the first magnetic field (bias level) 720, is still less than the trip level 716 for the hall-effect sensor 112. Because the trip level 716 has not been exceeded, the sensor output 144 is static—reflecting the magnet 104 has not been detected.

Referring now to FIG. 7D, a diagram illustrating magnetic object detection in partially sympathetic magnetic fields, in accordance with embodiments of the present application is shown. FIG. 7D illustrates a case where a magnet 104 enters a partially sympathetic magnetic field (first magnetic field 704) of the radially-wound coil 108. A partially sympathetic magnetic field where the first magnetic field 704 does not completely align or is completely opposed by the second magnetic field 708. In other words, there is an angular relationship between the first 704 and second 708 magnetic fields that is neither 0 nor 180 degrees. The partially sympathetic case illustrated in FIG. 7D applies to a more significant angular relationship in FIG. 7C, that contributes to the bias level 720 significantly enough to exceed the trip level 716.

The illustration in FIG. 7D applies to both unipolar and omnipolar sensing, but only illustrates the omnipolar case where the first magnetic field 704 has a positive polarity (i.e. where the north pole 124 extends toward the magnet 104, and the south pole 128 extends away from the magnet 104) and the polarity of the first magnetic field 704 is mostly aligned with the polarity of the second magnetic field 708.

The left side of FIG. 7D reflects the hall-effect sensor 112 does not detect the magnet 104. The first 704 and second 708 magnetic fields are partially sympathetically aligned, and the hall-effect sensor 112 does not detect the magnet 104 because the combination (sum) of the first magnetic field 704 and the second magnetic field 708 at the hall-effect sensor 112 does not exceed the trip level 716. The angle of the magnet 104 relative to the radially-wound coil 108 produces a major contribution to the bias level 720, but the separation between the magnet 104 and the hall-effect sensor 112 is too great to exceed the trip level 716.

The diagram in the lower left of FIG. 7D corresponds with the detection case in the upper left of FIG. 7D. Therefore, the detected field strength 712 (i.e. combination of the first 704 and second 708 magnetic fields) does not exceed the trip level 716 for the hall-effect sensor 112. Because the trip level 716 has not been exceeded, the sensor output 144 is static—reflecting no magnet 104 detected.

The right side of FIG. 7D reflects the hall-effect sensor 112 does detect the magnet 104, and the magnet 104 has moved into a detection distance. Even though the first 704 and second 708 magnetic fields are only partially sympathetically aligned to a major degree, the hall-effect sensor 112 does detect the magnet 104 because the combination (sum) of the first magnetic field 704 and the second magnetic field 708 at the hall-effect sensor 112 exceeds the trip level 716.

The diagram in the lower right of FIG. 7D corresponds with the detection case in the upper right of FIG. 7D. Therefore, the detected field strength 712 (i.e. combined strength 724 of the first 704 and second 708 magnetic fields) is greater than the strength of the first magnetic field (bias level) 720 as well as the trip level 716 for the hall-effect sensor 112. Because the trip level 716 has been exceeded, the sensor output 144 is active—reflecting the magnet 104 has been detected.

Figure 8:
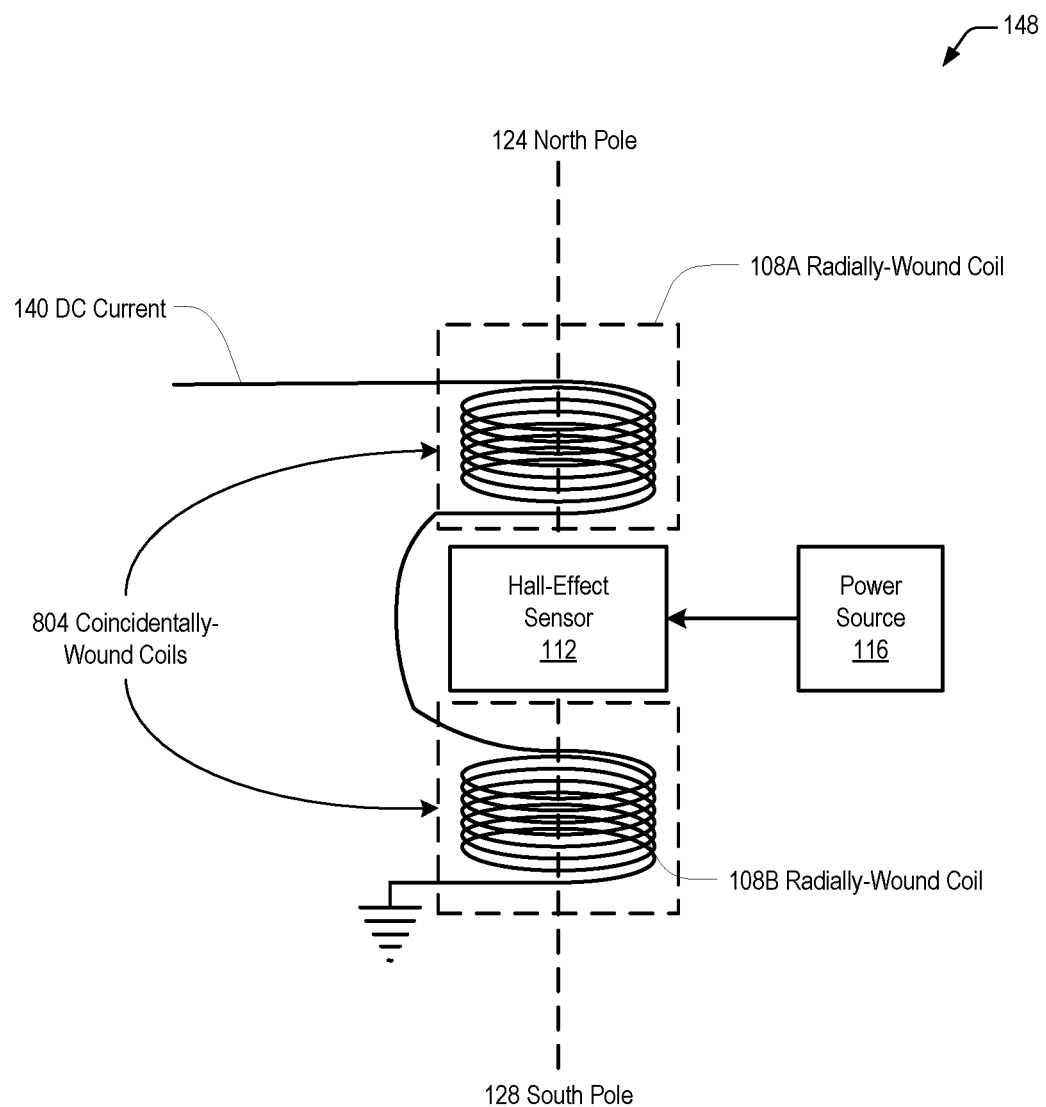
FIG. 8 is a diagram illustrating a dual-coil sense circuit, in accordance with embodiments of the present application.

Referring now to FIG. 8, a diagram illustrating a dual-coil sense circuit, in accordance with embodiments of the present application is shown. FIG. 1 illustrates a single-coil sense circuit 148 that includes a radially-wound coil 108, a hall-effect sensor 112, and a power source 116. That arrangement works well for magnets 104 on one side of the radially-wound coil 108.

However, for magnets 104 that may pass by either/both ends of the radially-wound coil 108, a dual-coil sense circuit 148 may be preferable. The dual-coil sense circuit 148 includes a hall-effect sensor 112 and power source 116 similar to the single-coil sense circuit 148, but includes two radially-wound coils 108, identified as radially-wound coil 108A and radially-wound coil 108B. The two coils 108A, 108B are identically and coincidentally wound 804 to each other, where both coils 108A, 108B are wound in a clockwise direction or both coils 108A, 108B are wound in a counterclockwise direction. A single DC current 140 source drives both coils 108A, 108B, and the coils 108A, 108B may be interconnected as shown.

Figure 9:
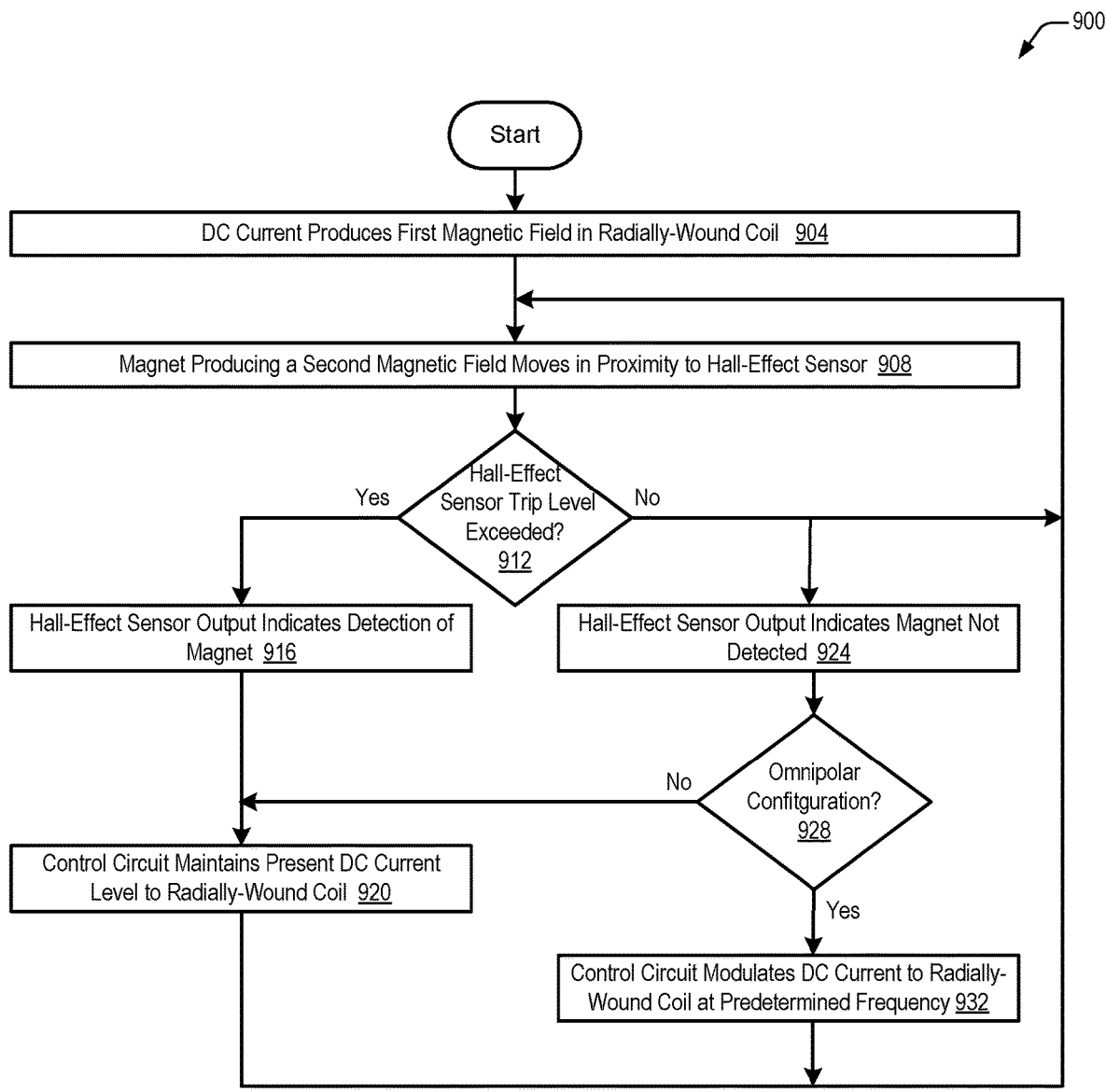
FIG. 9 is a flowchart illustrating a magnet detection process in accordance with embodiments of the present application.

Referring now to FIG. 9, a flowchart illustrating a magnet detection process 900 in accordance with embodiments of the present application is shown. Flow begins at block 904.

At block 904, a DC current 140 produces a first magnetic field 704 in a radially-wound coil 108. The DC current 140 corresponds to a bias level of a hall-effect sensor 112. Flow proceeds to block 908.

At block 908, a magnet 104 producing a second magnetic field 708 moves in proximity to the hall-effect sensor 112. The movement may be in any direction, combination of directions, velocity/velocities, and acceleration/accelerations. Flow proceeds to decision block 912.

At decision block 912, a determination is made if a trip level 716 of the hall-effect sensor 112 has been exceeded. If the trip level 716 of the hall-effect sensor 112 has been exceeded, then flow proceeds to block 916. If instead a trip level 716 of the hall-effect sensor 112 has not been exceeded, then flow instead proceeds to block 924.

At block 916, the hall-effect sensor trip level 716 has been exceeded, and an output of the hall-effect sensor 144 indicates detection of the magnet 104. Flow proceeds to block 920.

At block 920, a control circuit 120 maintains present DC current 140 levels to the radially-wound coil 108. Flow proceeds to block 908 to continue to track the magnet 104.

At block 924, the trip level 716 for the hall-effect sensor 112 has not been exceeded, and the sensor output 144 for the hall-effect sensor 112 does not indicate a magnet 104 is detected. Flow proceeds to decision block 928.

At decision block 928, operation changes based on whether the device is operating with an omnipolar configuration. If the device is not operating with an omnipolar sensing configuration (e.g. presumably with a unipolar configuration instead), then flow proceeds to block 920. If the device is operating with an omnipolar sensing configuration, then flow instead proceeds to block 932.

At block 932, the control circuit 120 modulates the DC current 140 to the radially-wound coil 108 at a predetermined frequency, in order to alternate the polarity of the first magnetic field 704 to better track magnets 104 with an unknown orientation. Flow proceeds to block 908 to continue to track the magnet 104.

Finally, those skilled in the art should appreciate that they can readily use the disclosed conception and specific embodiments as a basis for designing or modifying other structures for carrying out the same purposes of the present application without departing from the spirit and scope of the application as defined by the appended claims.

It will be readily understood that the components of the application, as generally described and illustrated in the figures herein, may be arranged and designed in a wide variety of different configurations. Thus, the detailed description of the embodiments is not intended to limit the scope of the application as claimed, but is merely representative of selected and exemplary embodiments of the application.

One having ordinary skill in the art will readily understand that the application as discussed above may be practiced with steps in a different order, and/or with hardware elements in configurations that are different than those which are specifically disclosed. Therefore, although the application has been described based upon these preferred embodiments, it would be apparent to those of skill in the art that certain modifications, variations, and alternative constructions would be apparent, while remaining within the spirit and scope of the application. In order to determine the metes and bounds of the application, therefore, reference should be made to the present claims.

While preferred embodiments of the present application have been described, it is to be understood that the embodiments described are illustrative only and the scope of the application is to be defined solely by the appended claims when considered with a full range of equivalents and modifications (e.g., protocols, hardware devices, software platforms etc.) thereto.

I claim:

1. A device comprising:
   a radially-wound coil configured to produce a first magnetic field in response to a current applied to the coil, wherein the device is configured in an omnipolar configuration;
   a hall-effect sensor comprising a sensor output that indicates proximity of a magnet to the hall-effect sensor, the magnet providing a second magnetic field, the sensor output indicates proximity in response to a combination of a strength of the first magnetic field and a strength of the second magnetic field at the hall-effect sensor exceeds a trip level, the radially-wound coil in fixed proximity to the hall-effect sensor;
   power source, coupled to the hall-effect sensor, configured to provide power that alternates between on and off voltages to the hall-effect sensor; and
   a control circuit, configured to:
   receive the sensor output and in response provide the current to the radially-wound coil in order to control a polarity of the first magnetic field to detect the magnet, and
   control the polarity of the first magnetic field, comprising:
   in response to the sensor output does not indicate detection of the magnet, the current symmetrically alternates between a positive and a negative value at a predetermined frequency; or
   in response to the sensor output indicates detection of the magnet, the current does not change.

2. The device of claim 1, wherein the radially-wound coil in fixed proximity to the hall-effect sensor comprises the radially wound coil in a centered and coaxial orientation with respect to the hall-effect sensor, the radially-wound coil separated from the hall-effect sensor by not more than a separation distance.

3. The device of claim 1, wherein an on time for the on voltage and an off time for the off voltage-of the power source corresponds to a maximum turn on time specification for the hall-effect sensor.

4. The device of claim 1, wherein the control circuit biases the first magnetic field through the current to a bias level just below the trip level, wherein the strength of the second magnetic field depends on characteristics of magnets to be detected, the characteristics comprising the strength of the magnet, an orientation of the magnet to the radially-wound coil, and a distance between the magnet and the hall-effect sensor.

5. The device of claim 1, wherein the device senses proximity of the magnet from a single direction from the magnet.

6. A system, comprising:
   a sense circuit, comprising:
   a radially-wound coil configured to produce a first magnetic field in response to a current applied to the coil, wherein the device is configured in an omnipolar configuration; and
   a hall-effect sensor comprising a sensor output comprising a trip level, the radially-wound coil in fixed proximity to the hall-effect sensor; and
   a power source, coupled to the hall-effect sensor, configured to provide power that alternates between on and off voltages to the hall-effect sensor;
   a magnet that produces a second magnetic field, the magnet configured to move in one or more directions with respect to the hall-effect sensor, the sensor output indicates proximity of the magnet to the hall-effect sensor in response to a combination of a strength of the first magnetic field and a strength of the second magnetic field at the hall-effect sensor exceeds the trip level; and a control circuit, coupled to the sense circuit, configured to:

produce the current to the radially-wound coil, and control the polarity of the first magnetic field, comprising:

in response to the sensor output does not indicate detection of the magnet, the current symmetrically alternates between a positive and a negative value at a predetermined frequency; or in response to the sensor output indicates detection of the magnet, the current does not change.

7. The system of claim 6, wherein the radially-wound coil in fixed proximity to the hall-effect sensor comprises the radially wound coil in a centered and coaxial orientation with respect to the hall-effect sensor, the radially-wound coil separated from the hall-effect sensor by not more than a separation distance.

8. The system of claim 6, wherein an on time for the on voltage and an off time for the off voltage-of the power source corresponds to a maximum turn on time specification for the hall-effect sensor.

9. The system of claim 6, wherein the control circuit biases the first magnetic field through the current to a bias level just below the trip level, wherein the strength of the second magnetic field depends on characteristics of magnets to be detected, the characteristics comprising the strength of the magnet, an orientation of the magnet to the radially-wound coil, and a distance between the magnet and the hall-effect sensor.

10. The system of claim 6, wherein the sense circuit senses proximity of the magnet from a single side of the magnet.

11. A method, comprising:

producing a first magnetic field in a radially-wound coil by a current, the current providing a bias level of a hall-effect sensor in fixed proximity to the radially-wound coil, the hall-effect sensor comprising a sensor output and the first magnetic field being in an omnipolar configuration;

providing power comprising an on voltage for an on time and an off voltage for an off time to the hall-effect sensor;

symmetrically alternating the current between a positive and a negative value at a switching frequency;

moving a magnet producing a second magnetic field within a detection range of the hall-effect sensor;

indicating detection of the magnet, by the sensor output, in response to a combination of a strength of the first magnetic field and a strength of the second magnetic field exceeds a trip level of the hall-effect sensor, the trip level being higher than the bias level;

in response to the sensor output indicating detection of the magnet:

maintaining the current at a same level; and in response to the hall-effect sensor no longer detects the magnet:

resuming the current at the bias level.

12. The method of claim 11, wherein the radially-wound coil in fixed proximity to the hall-effect sensor comprising the radially wound coil in a centered and coaxial orientation with respect to the hall-effect sensor, the radially-wound coil separated from the hall-effect sensor by not more than a separation distance.

13. The method of claim 11, wherein the on time and the off time corresponding to a maximum turn on time specification for the hall-effect sensor.

14. The method of claim 11, further comprising:

biasing the first magnetic field through the current to a bias level just below the trip level, wherein the strength of the second magnetic field depends on characteristics of magnets to be detected, the characteristics comprising the strength of the magnet, an orientation of the magnet to the radially-wound coil, and a distance between the magnet and the hall-effect sensor.

* * * * *